United States Patent [19]

Suzuki

[11] Patent Number: 5,574,695
[45] Date of Patent: Nov. 12, 1996

[54] SEMICONDUCTOR MEMORY DEVICE WITH BIT LINE LOAD CIRCUIT FOR HIGH SPEED OPERATION

[75] Inventor: Azuma Suzuki, Tokyo, Japan

[73] Assignee: Kabushiki Kaisha Toshiba, Kawasaki, Japan

[21] Appl. No.: 397,678

[22] Filed: Mar. 2, 1995

[30] Foreign Application Priority Data

Mar. 4, 1994 [JP] Japan .................................. 6-034852

[51] Int. Cl.⁶ .................................................. G11C 8/00
[52] U.S. Cl. ................ 365/203; 365/189.06; 365/189.11; 365/204
[58] Field of Search ............................. 365/203, 189.06, 365/189.11, 189.01, 204, 190

[56] References Cited

U.S. PATENT DOCUMENTS 4,928,268  5/1990  Nogle et al. ............................. 365/203
5,349,360  9/1994  Suh et al. ................................ 365/203

Primary Examiner—David C. Nelms
Assistant Examiner—Vu A. Le
Attorney, Agent, or Firm—Foley & Lardner

[57] ABSTRACT

A semiconductor memory has memory cells for data storage, connected to bit line pair a memory cell selection decoder for selecting the memory cell in the plurality of memory cells corresponding to a bit line direction address, a bit line load circuit for supplying a voltage potential to the bit line pair, and an impedance control circuit for receiving the bit line direction address and changing an impedance of the bit line load circuit according to the bit line direction address. The semiconductor memory performs data write-in and data readout operations from/to the memory cell in the plurality of memory cells selected by the memory cell selection decoder through the bit line pair.

17 Claims, 18 Drawing Sheets

SEMICONDUCTOR MEMORY DEVICE WITH BIT LINE LOAD CIRCUIT FOR HIGH SPEED OPERATION

BACKGROUND OF THE INVENTION

1. Field of the Invention

The present invention relates to a semiconductor memory device including a bit line load circuit or equalizing circuit (equalizer), and, in particular, to a semiconductor memory device of a high speed read-out operation, and the like.

2. Description of the Prior Art

Conventionally, the technology for this type of field is as illustrated, for example, in FIG. 1.

FIG. 1 is a main configuration diagram showing the configuration of a bit line peripheral circuit in a conventional static RAM (hereinafter referred to as an SRAM).

This SRAM is provided with a bit line pair BL, BLB and a plurality of word lines WL, arranged in a lattice form or a matrix form. The points of intersection are respectively connected to a memory cell 101.

The memory cell 101 comprises NMOSs 101a to 101d and resistances 101e and 101f, as shown in FIG. 2. A row decoder 102 for decoding row addresses (bit line direction addresses) is connected to the word lines WL.

The bit lines of the bit line pair BL, BLB are respectively connected to common data lines DL, DLB through transistor gates 103, 104.

The transfer gates 103, 104 operate for selecting column addresses, and controlling the ON and OFF states of these column addresses by means of a column signal CD transmitted from a column decoder 105 and an inverted column signal CDB which is the column signal CD inverted via an inverter 105a.

A bit line upper load circuit 106 is connected to the uppermost sections of the bit line pair BL, BLB. Also, a bit line lower load circuit 107 is connected to the common data lines DL, DLB through a common bit line pair CBL, CBLB. The bit line upper load circuit 106 comprises a plurality of P-MOSs 106a to 106e, and the bit line lower load circuit 107 comprises a plurality of P-MOSs 107a to 107c, as shown in FIG. 2.

A sense amplifier 108 for amplifying read data and transmitting this data to common read lines MS, MSB is connected to the bit line lower load circuit 107. The sense amplifier 108 comprises a pair of NPN transistors 108a, 108b and an N-MOS 108c, as shown in FIG. 2.

A section write enable generation circuit 109 is provided on this bit line peripheral circuit. The section write enable generation circuit 109 is a circuit for activating a write operation for the various sections when all the memory cells have been divided into a certain number of sections, and for transmitting a section write enable signal SWE and its inverted signal SWEB.

The section write enable signal SWE controls operations of the bit line upper load circuit 106 and the bit line lower load circuit 107. This signal changes to the low level for an unselected section or during a read operation, and acts so that the impedance of the bit line load is small, the impedance of the bit line load is large only when there is a selected section and a write, and the write operation is not influenced by the bit line load.

The inverted signal SWEB of the section write enable signal SWE is at the high level during a read out for a section selected from a section divided into several sections, and activates the sense amplifier 108. Data from the memory cell 101 is transmitted to the common read lines MS, MSB, is at the low level during a write-in or for a selected section, and inactivates the sense amplifier 108.

In addition, the write circuit 110 is connected to the common bit lines CBL, CBLB.

Next, the operation of the above-mentioned bit line peripheral circuit will be explained.

When the word line WL and the column line CD specified by the row address and the column address are activated by the row decoder 102 and the column decoder 105, the transfer gates 103, 104 are turned ON, and the memory cell 101 corresponding to the row address and the column address is selected.

During a read operation, the section write enable signal SWE and the inverted signal SWEB thereof are changed to the low level and the high level respectively. The impedance of the bit line upper load circuit 106 and that of the bit line lower load circuit 107 are reduced by the section write enable signal SWE. Also, the sense amplifier 108 is activated by the section write enable signal SWEB.

As a result, data which is "1" or "0" stored in the selected memory cell 101 is transmitted to the common read line MS via the bit line BL and the common bit line CBL. In the same manner, the inverted data read out from the memory cell 101 is transmitted to the common read line MSB via the bit line BLB and the common bit line CBLB.

During a write operation, the section write enable signal SWE is changed to the high level and the inverted signal SWEB thereof is changed to the low level. The impedance of the bit line upper load circuit 106 and that of the bit line lower load circuit 107 are increased by the section write enable signal SWE. Also, the sense amplifier 108 is inactivated by the section write enable signal SWEB.

As a result, when the write data is supplied to the bit line BL and the inverted write data is supplied to the bit line BLB by the write circuit 110, the data is stored in the memory cell 101.

FIG. 3 is a diagram showing the condition of a conventional bit line amplitude $\Delta VBL$ corresponding to a bit line position.

Here, the bit line amplitude $\Delta VBL$ can be represented as:

$$\Delta VBL = \Delta VBL - \Delta VBLB$$

where VBL is the voltage of the bit line BL and VBLB is the voltage of the bit line BLB.

Changes in the bit line amplitude $\Delta VBL$ shown in the drawing are produced by the different row addresses accessed.

In the case where the memory cell 101 positioned on the upper section of the bit line pair BL, BLB is accessed, when the bit line BL and the bit line BLB are at the low level and the high level respectively, a current I1+i1 (I1>i1) from the bit line upper load circuit 106 or a current I2+i2 (I2>i2) from the bit line lower load circuit 107 flows into the memory cell 101, and a cell current Icell becomes Icell=I1+i1+I2+i2. In this case I1+i1>>I2+i2 and the bit line amplitude $\Delta VBL$ can be illustrated as the solid line $\Delta VBL1$ in FIG. 3.

In the case where the memory cell 101 positioned on the lower section of the bit line pair BL, BLB is accessed, when the bit line BL and the bit line BLB are at the low level and the high level respectively, a current I1'+i1' (I1'>i1') from the bit line upper load circuit 106 or a current I2'+i2' (I2'>i2') from the bit line lower load circuit 107 flows into the memory cell 101 in the same manner, and a cell current Icell' becomes Icell'=I1'+i1'+I2'+i2'. In this case I1'+i1'>I2'+i2' and I2<<I2' and i2<i2', and, also, the bit line amplitude ΔVBL can be illustrated as the solid line D VBL2 in FIG. 3.

In the case where the impedance of the bit line upper load circuit 106 is r0 and the impedance of the bit line lower load circuit 107 is r1, the relationship between the two impedances is r1>>r0. In addition, the bit line amplitude D VBL entering the sense amplifier 108 when the lower section of the memory cell 101 is accessed becomes r0(I2–i2) and when the lower section of the memory cell 101 is accessed becomes r1(I2'–i2'). The relationship is r0(I2–i2)<r1(I2'–i2').

When the bit line resistance from the upper memory cell 101 to the bit line upper load circuit 106 is R1 and the bit line resistance from the upper memory cell 101 to the bit line lower load circuit 107 is R2, the maximum value of the bit line amplitude ΔVBL1 can be represented as R2(I2+i2). Also, when the resistance of the bit line BLB from the lower memory cell 101 to the bit line upper load circuit 106 is R1 and the resistance of the bit line BLB from the lower memory cell 101 to the bit line lower load circuit 107 is R2, the maximum value of the bit line amplitude ΔVBL2 can be represented as R2'(I2'+i2').

Next, as another example of a conventional bit line peripheral circuit, in the above-mentioned bit line peripheral circuit of FIG. 7, an explanation is given for the case where the bit line upper load circuit 106 only is omitted.

FIG. 4 is a diagram showing the condition of the bit line amplitude ΔVBL corresponding to the bit line position in this case.

In the case where the memory cell 101 (upper memory cell) positioned in the upper section of the bit line pair BL, BLB is accessed, a cell current Icell=I3+i3 flows into the upper memory cell 101 from the bit line lower load circuit 107. In this case the bit line amplitude ΔVBL can be represented as the solid line ΔVBL3 in FIG. 4. On the other hand, in the case where the lower memory cell 101 positioned in the lower section of the bit line pair BL, BLB is accessed, the bit line amplitude ΔVBL is added on the solid line ΔVBL3 in FIG. 4, corresponding to the above-mentioned bit line position.

In this case, when the impedance of the bit line lower load circuit 107 is r2, the bit line amplitude ΔVBL entering the sense amplifier 108, as clearly shown in FIG. 4, is not related to the bit line position of the accessed memory cell, but normally is equivalent to r2(I3–i3).

However, the following problem areas exist in the above-mentioned conventional semiconductor memory of the bit line load circuit type.

When the memory size (or volume) is small and the bit line length is short, as shown in FIG. 4, it is preferable to provide a bit line load circuit on the lower section only. This is because the bit line amplitude ΔVBL transmitted to the sense amplifier 108 is normally set at r2(I3–i3), unrelated to the bit line position of the accessed memory cell. However, in the case where the memory size or memory volume is large and the bit line length is long, when the bit line load circuit is provided on the lower section only, the difference in the bit line amplitudes ΔVBL on the bit line is large, and the inverted speed of the data on the bit line pair BL, BLB is rather retarded.

Accordingly, in the case where the bit line load circuit is provided on both the upper and lower sections, as shown in FIG. 3, the difference in the bit line amplitudes ΔVBL on the accessed bit line is limited within a certain range, and the row address dependence of the inverted speed of the data on the bit line pair BL, BLB is small.

However, as outlined above, the bit line amplitude ΔVBL transmitted to the sense amplifier 108 is r1(I2–i2) when the memory cell 101 of the upper section of the bit line is accessed, and is r1(I2'–i2') when the memory cell 101 of the lower section of the bit line is accessed, so there is still dependence on the row address.

As a result, there is the problem of wide variation in the access times of the addresses during read-out.

FIGS. 5A to 5C are characteristic diagrams for specifically explaining this point.

FIG. 5A is a diagram illustrating the dependence of the bit line delay on the bit line amplitude ΔVBL.

FIG. 5B is a diagram illustrating the dependence of the sense amplifier delay on the bit line amplitude ΔVBL.

FIG. 5C is a diagram illustrating the dependence of the read-out delay on the bit line amplitude ΔVBL obtained from these characteristics.

As clearly shown in FIG. 5A, because the bit line delay increases as the bit line amplitude ΔVBL increases, time is required for the data inversion. As clearly shown in FIG. 5B, because the sense amplifier delay decreases as the bit line amplitude ΔVBL increases, the gain increases and the read-out operation is speeded up. Also, as clearly shown in FIG. 5C, if the bit line amplitude ΔVBL becomes too small, the read-out delay resulting from the sense amplifier delay is increased, and if the bit line amplitude D VBL becomes too large, the read-out delay resulting from the bit line delay is also increased.

Accordingly, with the above-mentioned conventional bit line load circuit type of memory, in particular, in the case of a large size memory or large volume memory, the row address dependence of the bit line amplitude is large, and the variation in the access times of the addresses during read-out is great.

SUMMARY OF THE INVENTION

Accordingly, an object of the present invention is, with due consideration to the drawbacks of such a conventional semiconductor memory device described above, to provide a semiconductor memory device with little dependence on the row address of the bit line amplitude ΔVBL causing an improvement in the variation in the access times of the addresses during read-out.

A further object of the present invention is to provide a semiconductor memory device which can be accessed at high speed.

As a preferred embodiment of the present invention, a semiconductor memory comprises:

a plurality of memory cells for data storage, connected to bit line pair;

a memory cell selection decoder for selecting the memory cell in the plurality of memory cells corresponding to a bit line direction address;

bit line load means for supplying a voltage potential to the bit line pair; and impedance control means for receiving the bit line direction address and changing an impedance of the bit line load means according to the bit line direction address, wherein the semiconductor memory performs data write-in and data readout operations from/to the memory cell in the plurality of memory cells selected by the memory cell selection decoder through the bit line pair.

The semiconductor memory described above, further comprises write-in control signal generation means for receiving the bit line direction address and generating a write-in control signal for performing the write-in operation, and changing one part of the impedance of the bit line load means according to the write-in control signal. In the semiconductor memory, the impedance control means changes the other part of the impedance of the bit line load means according to a result of an logical AND arithmetic operation between the bit line direction address and the write-in control signal.

As another preferred embodiment of the present invention, a semiconductor memory comprises:

a plurality of bit line pairs;

a plurality of memory cells for data storage, connected to the plurality of bit line pair;

a memory cell selection decoder for selecting the memory cell in the plurality of memory cells corresponding to a bit line direction address;

bit line load means for supplying a voltage potential to each of the plurality of bit line pairs; and impedance control means for receiving the bit line direction address and changing an impedance of the bit line load means for the selected bit line according to the bit line direction address, and for generating a control signal to indicate performing the voltage supply operation of the bit line load means corresponding to the plurality of bit line pairs which being not selected, independent of the bit line direction address and read-out/write-in operations.

As another preferred embodiment of the present invention, a semiconductor memory comprises:

a plurality of bit line pairs;

a plurality of memory cells for data storage, connected to the plurality of bit line pair;

a memory cell selection decoder for selecting the memory cell in the plurality of memory cells corresponding to a bit line direction address;

bit line load means for supplying a voltage potential to each of the plurality of bit line pairs; and impedance control means for receiving the bit line direction address and changing an impedance of the bit line load means according to the bit line direction address, and for generating a control signal to indicate performing the voltage supply operation of the bit line load means corresponding to the plurality of bit line pairs which being selected, independent of the bit line direction address during a rear half of a write-in operation cycle.

In the semiconductor memory described above, the bit line load means comprises a plurality of bit line load circuits whose impedance being changed by the impedance control means by using the bit line direction address, and the plurality of bit line load circuits are provided at one point or at a plurality of points in each of the plurality of bit line pairs.

In the semiconductor memory described above, the plurality of bit line load circuits are provided at an uppermost section over the uppermost memory cell along to the bit line direction and a lowermost section under the lowermost memory cell along to the bit line direction, the impedance control means changes the impedance of the bit line load circuit located in the uppermost section which being greater than the impedance of the bit line load circuit located in the lowermost section during an access operation to the memory cell located in the uppermost section, and changes the impedance of the bit line load circuit located in the uppermost section which being smaller than the impedance of the bit line load circuit located in the lowermost section during an access operation to the memory cell located in the lowermost section, In the semiconductor memory described above, the plurality of bit line load circuits are provided at a plurality of sections in each of the bit line pairs, and the impedance control means changes that the impedance of the bit line load circuit to be accessed according to the bit line direction address is greater than the impedance of the bit line load circuits other than the bit line load circuit to be accessed.

In the semiconductor memory described above, each of the bit line load means comprises a first load circuit and a second load circuit, each of the first and second load circuits comprises a first and second transistors provided between each of the plurality of bit line pairs, a source of each of the first and second transistors is connected to a power supply, and third and fourth transistors provided between the first and second transistors, and the impedance control means changes the impedances of the first load circuit and the second load circuit by connecting the power source to each of the bit line pairs by switching ON/OFF of the first to third transistors.

In the semiconductor memory described above, the impedance means changes a voltage potential of a gate of each of the first to third transistors when each of the first to third transistors is a MOS FET, and changes a voltage potential of a base of each of the first to third transistors when each of the first to third transistors is a bipolar transistor in order to change the impedance of the bit line load means.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Other features of this invention will become apparent in the course of the following description of exemplary embodiments which are given for illustration of the invention and are not intended to be limiting thereof.

Embodiments of the present invention will now be explained with reference to the drawings.

Figure 1:
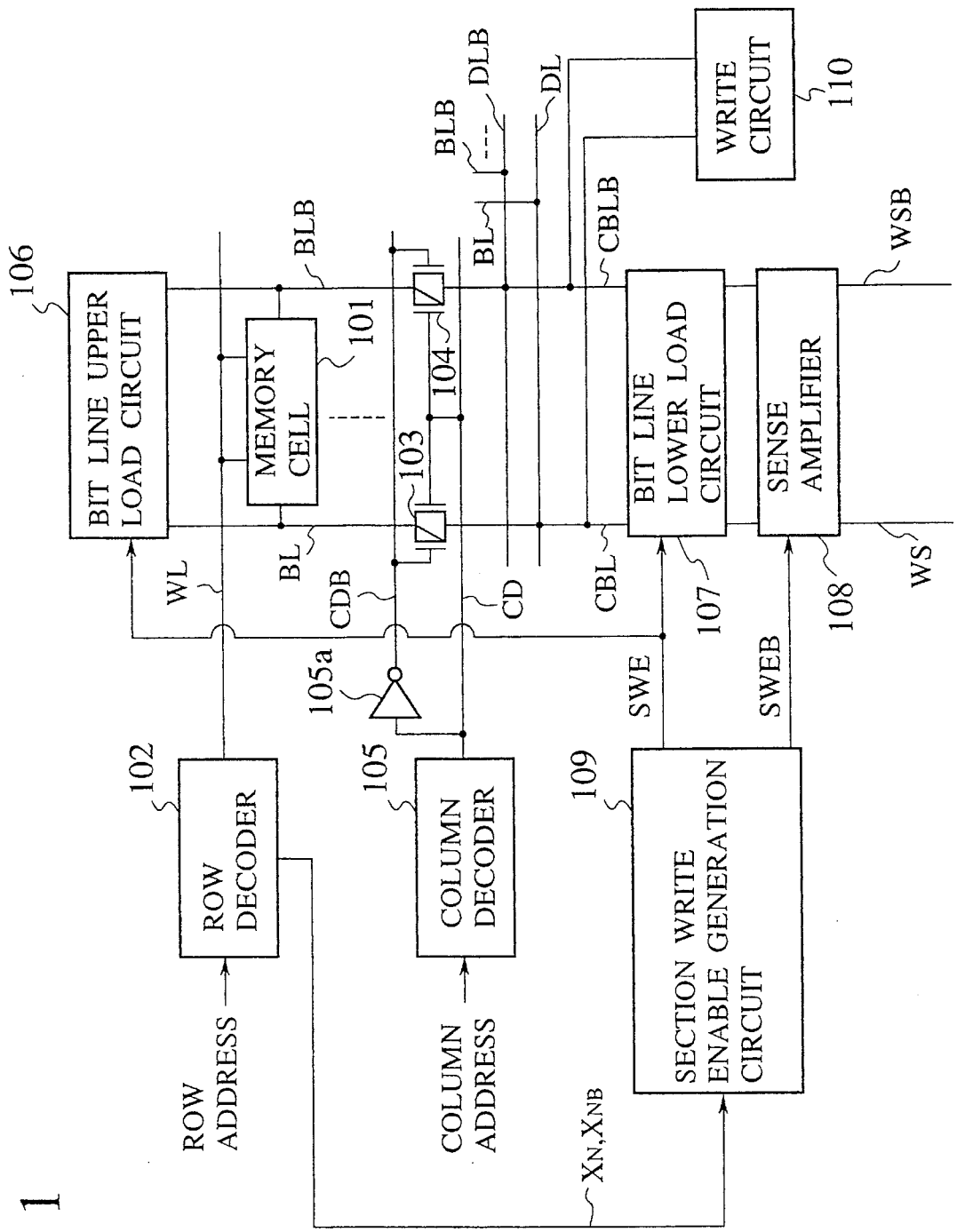
FIG. 1 is a main configuration diagram of a bit line peripheral circuit in a conventional semiconductor memory such as a SRAM.
Figure 2:
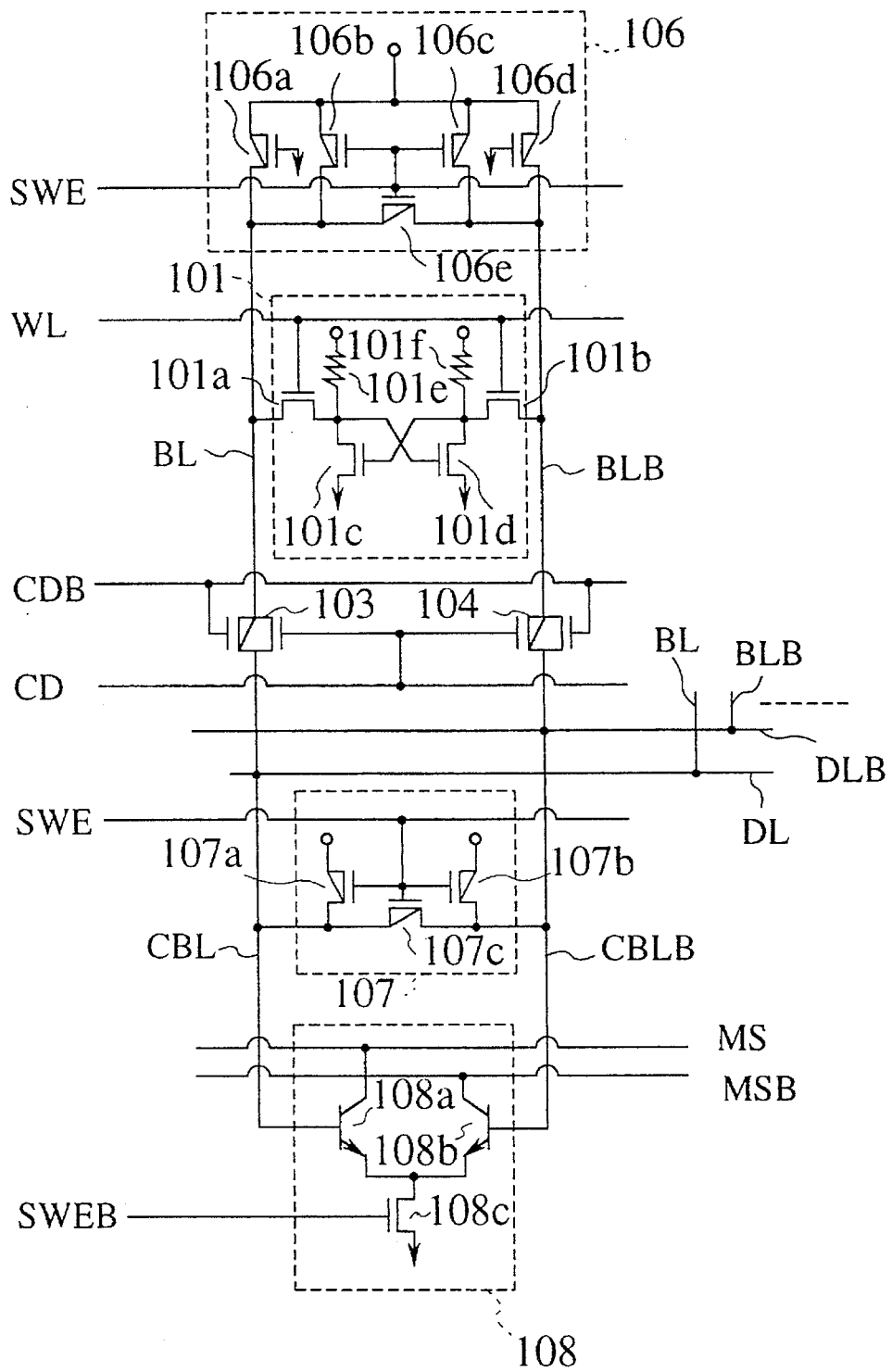
FIG. 2 is a circuit diagram showing a specific example of the bit line peripheral circuit shown in FIG. 1.
Figure 3:
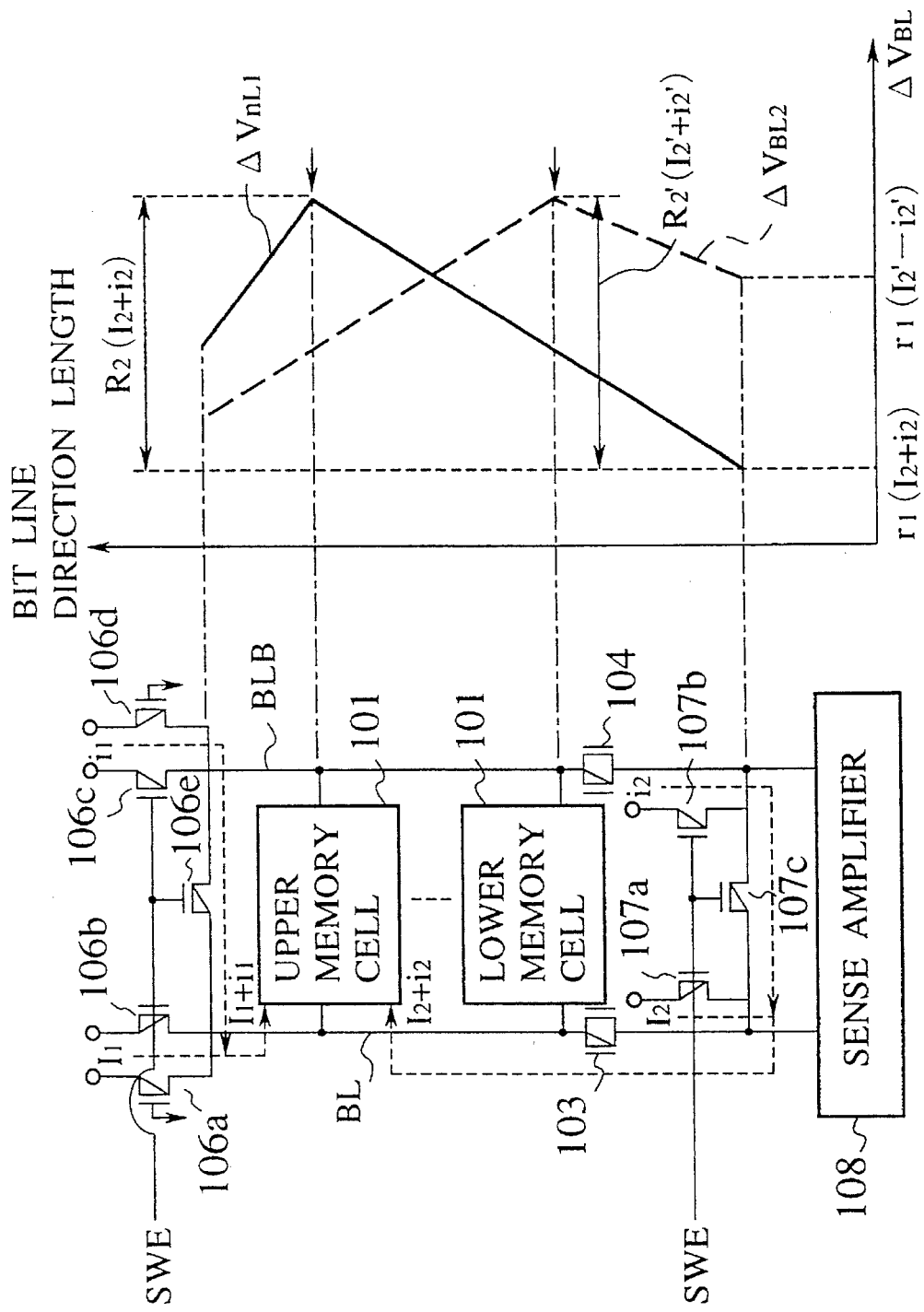
FIG. 3 is a diagram showing the condition of a bit line amplitude $\Delta VBL$ corresponding to a conventional bit line position.
Figure 4:
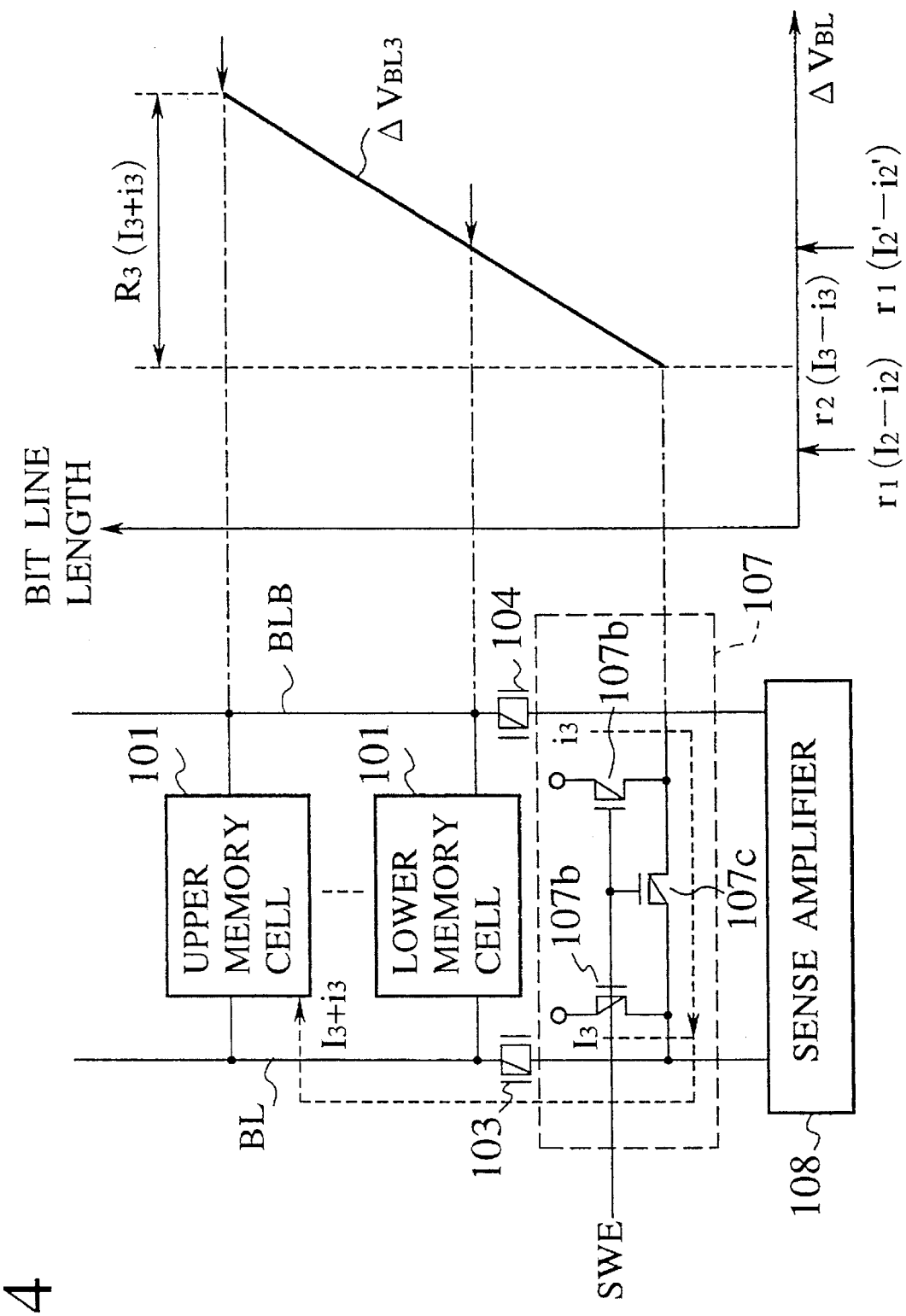
FIG. 4 is a diagram showing the condition of another bit line amplitude $\Delta VBL$ corresponding to a conventional bit line position.
Figure 5A:
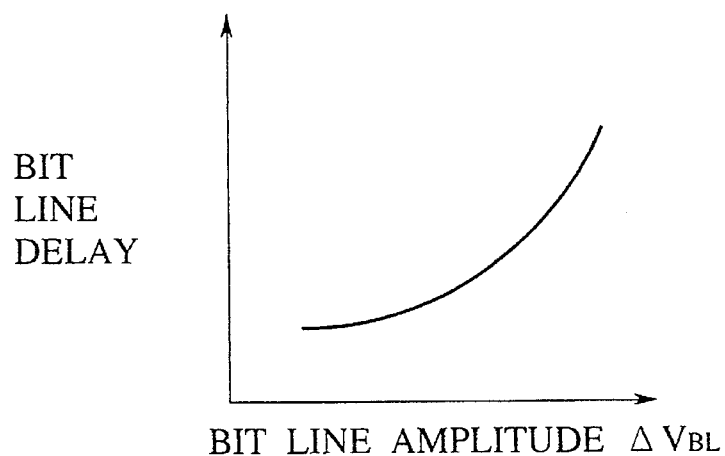
FIG. 5A is a diagram illustrating the dependence of the bit line delay on the bit line amplitude $\Delta VBL$.
Figure 5B:
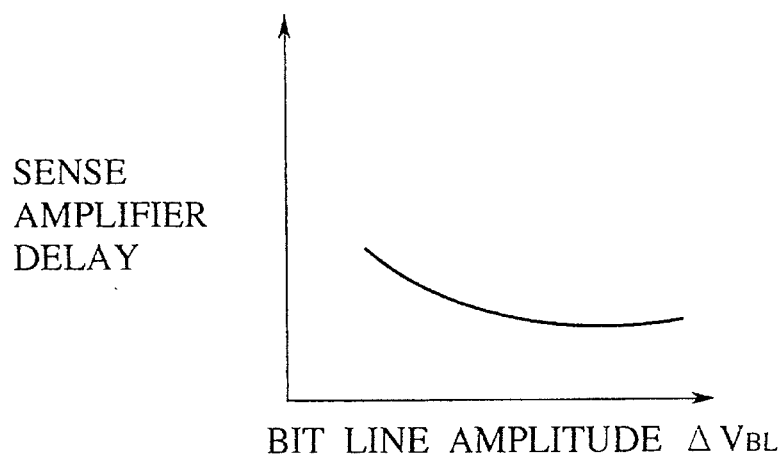
FIG. 5B is a diagram illustrating the dependence of the sense amplifier delay on the bit line amplitude $\Delta VBL$.
Figure 5C:
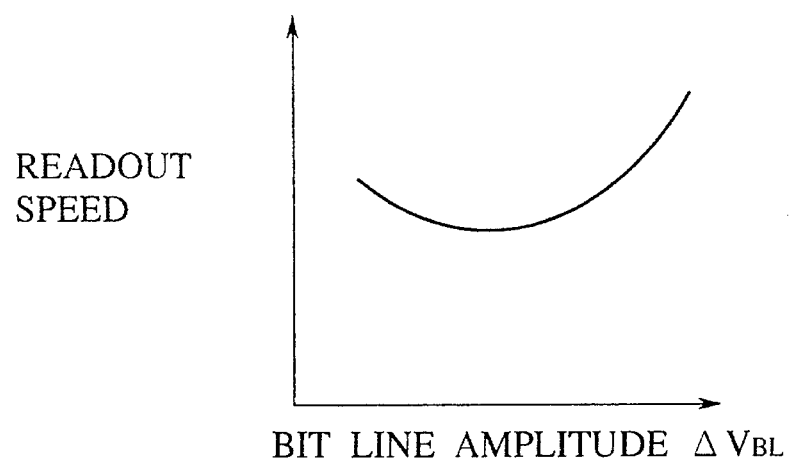
FIG. 5C is a diagram illustrating the dependence of the read-out delay on the bit line amplitude $\Delta VBL$ obtained from these characteristics.
Figure 6:
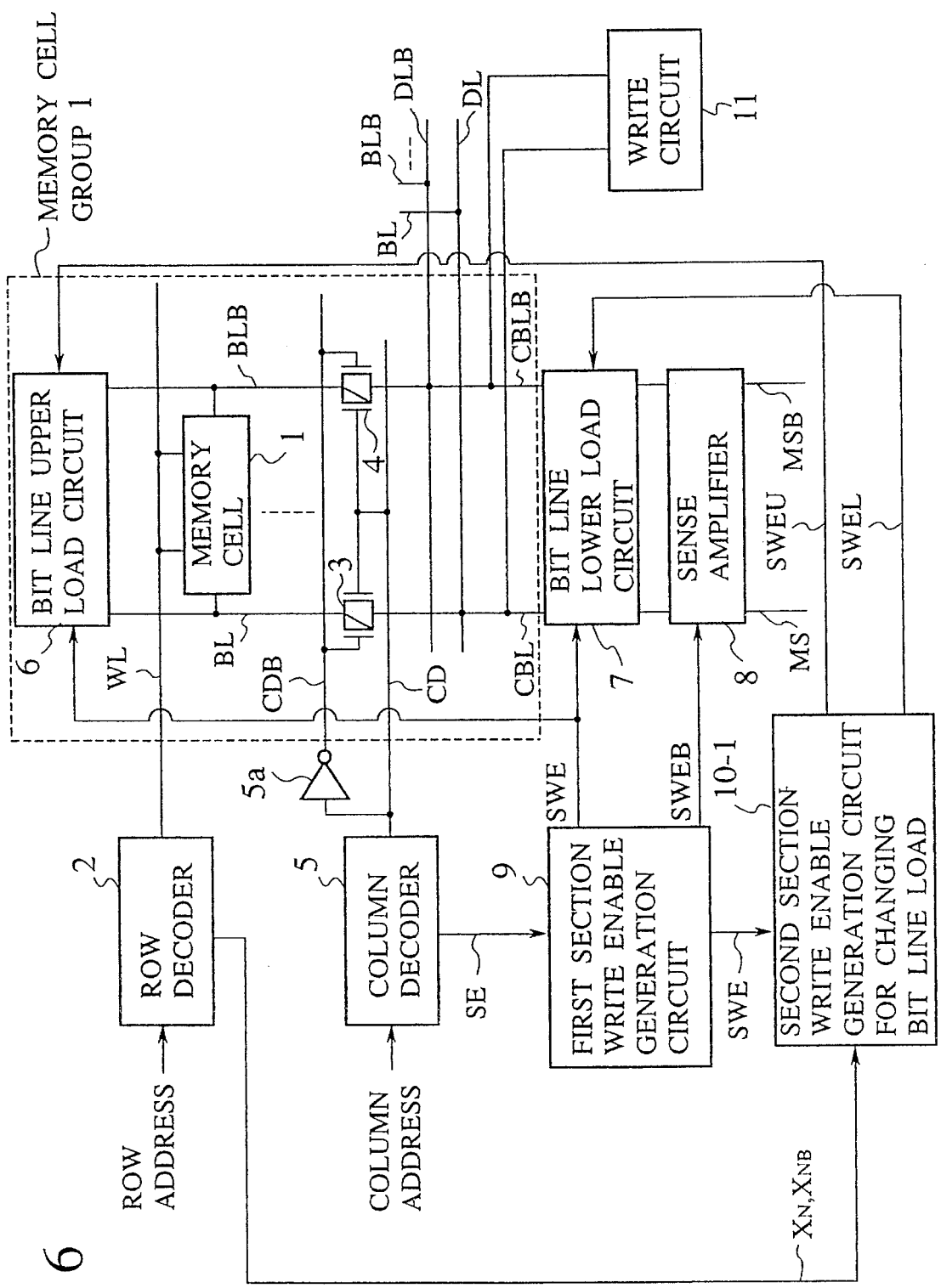
FIG. 6 is a main block diagram showing the configuration of a bit line peripheral circuit in a semiconductor memory such as a SRAM which is an embodiment of a semiconductor memory device of the present invention.

FIG. 6 is a main block diagram showing the configuration of a bit line peripheral circuit of an SRAM which is an embodiment of a semiconductor memory of the present invention.

The bit line peripheral circuit of the SRAM of this embodiment basically has a configuration comprising the addition of a second section write enable generating circuit 10-1 for changing the previously-described bit line load in the conventional bit line peripheral circuit. Specifically, this SRAM comprises a bit line pair BL, BLB and a plurality of word lines WL, arranged in a lattice form or in a matrix form. The points of intersection are respectively connected to a memory cell 1 (hereinafter a cell) for storing data. A row decoder 2 for decoding row addresses supplied from an external source is connected to the word lines WL. The bit lines of the bit line pair BL, BLB are respectively connected to common data lines DL, DLB through transfer gates 3, 4.

The transfer gates 3, 4 comprise a P-MOS transistor (hereinafter a P-MOS) and an N-MOS transistor (hereinafter an N-MOS) respectively, and perform to turn these column addresses ON and OFF by means of a column signal CD transmitted from a column decoder 5 and an inverted column signal CDB which is the column signal CD inverted via an inverter 5a, and turn the bit line pair BL, BLB on and off.

Also, a bit line upper load circuit 6 is connected to the uppermost sections of the bit line pair BL, BLB. In addition, a bit line lower load circuit 7 is connected to the data lines DL, DLB through a common bit line pair CBL, CBLB. The bit line upper load circuit 6 and the bit line lower load circuit 7 have the function of supplying an electrical potential to the bit line pair BL, BLB.

A sense amplifier 8 for amplifying read data and transmitting this data to common read lines MS, MSB is connected to the bit line lower load circuit 7.

A first section write enable generation circuit 9 is provided on the bit line peripheral circuit of this embodiment. The first section write enable generating circuit 9 is a circuit for activating a write operation for the various sections when all the memory cells have been divided into a several sections and for transmitting a section write enable signal SWE and its inverted signal SWEB.

The section write enable signal SWE controls the bit line upper load circuit 6 and the bit line lower load circuit 7. This signal is at the low level for an unselected section or during a read operation, and performs so that the impedance of the bit line load circuits 6, 7 is small, the impedance of the bit line load circuits 6, 7 becomes large, only when there is a selected section in a write-in operation, not to influence the write operation in the bit line load.

The inverted signal SWEB of the section write enable signal SWE is at the high level during a read out for a section selected from a section divided into several sections, and activates the sense amplifier 8. Data from the cell 1 is transmitted to the common read lines MS, MSB, is at the low level during a write-in or for a unselected section, and inactivates the sense amplifier 8.

A second section write enable generation circuit (as an impedance control means) 10-1 for changing the bit line load, which has a special feature of the present invention, is connected to the column decoder 5 and the row decoder 2 through the first section write enable generation circuit 9.

The uppermost bit of the row address from the row decoder 2 and the section write enable signal SWE from the first section write enable generating circuit 9 are received into the second section write enable generating circuit 10 to generate a signal SWEU for controlling the bit line load circuit 6 and a signal SWEL for controlling the bit line load circuit 7 respectively.

A write circuit 11 for writing data into the cell 1 during the write-in operation is connected to the common bit lines CBL, CBLB.

Figure 7:
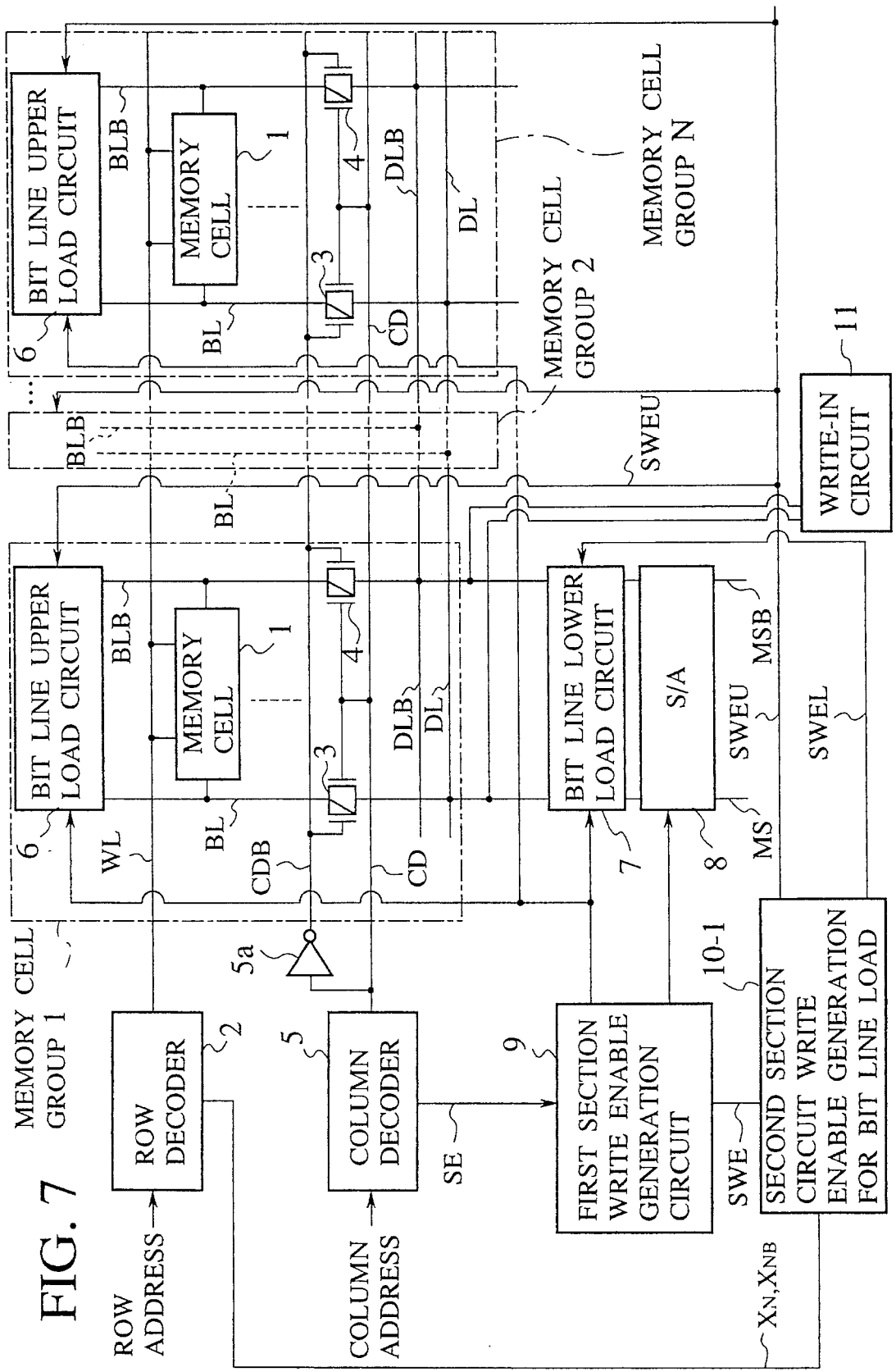
FIG. 7 is a configuration diagram of a memory cell section comprising a plurality of bit line peripheral circuits shown in FIG. 6 in the semiconductor memory of the present invention.

FIG. 7 is a configuration diagram of a memory cell section (1) in a semiconductor memory cell. The memory cell section shown in FIG. 7 comprises a plurality of memory cell groups (1) to (N). In FIG. 7, the row decoder 2, the column decoder 5, the bit line lower load circuit 7, the sense amplifier (S/A) 8, the first section write enable generation circuit 9, the second section write enable generation circuit 10-1 for bit line load, and the write-in circuit 11 are provided for one memory cell section (1).

Each of the memory cell groups 1 to N comprises a plurality of memory cells, the bit line upper load circuit 6, the transfer gates 3, 4. The configuration and the operation in each of the memory cell group are as same as to each other.

Figure 8:
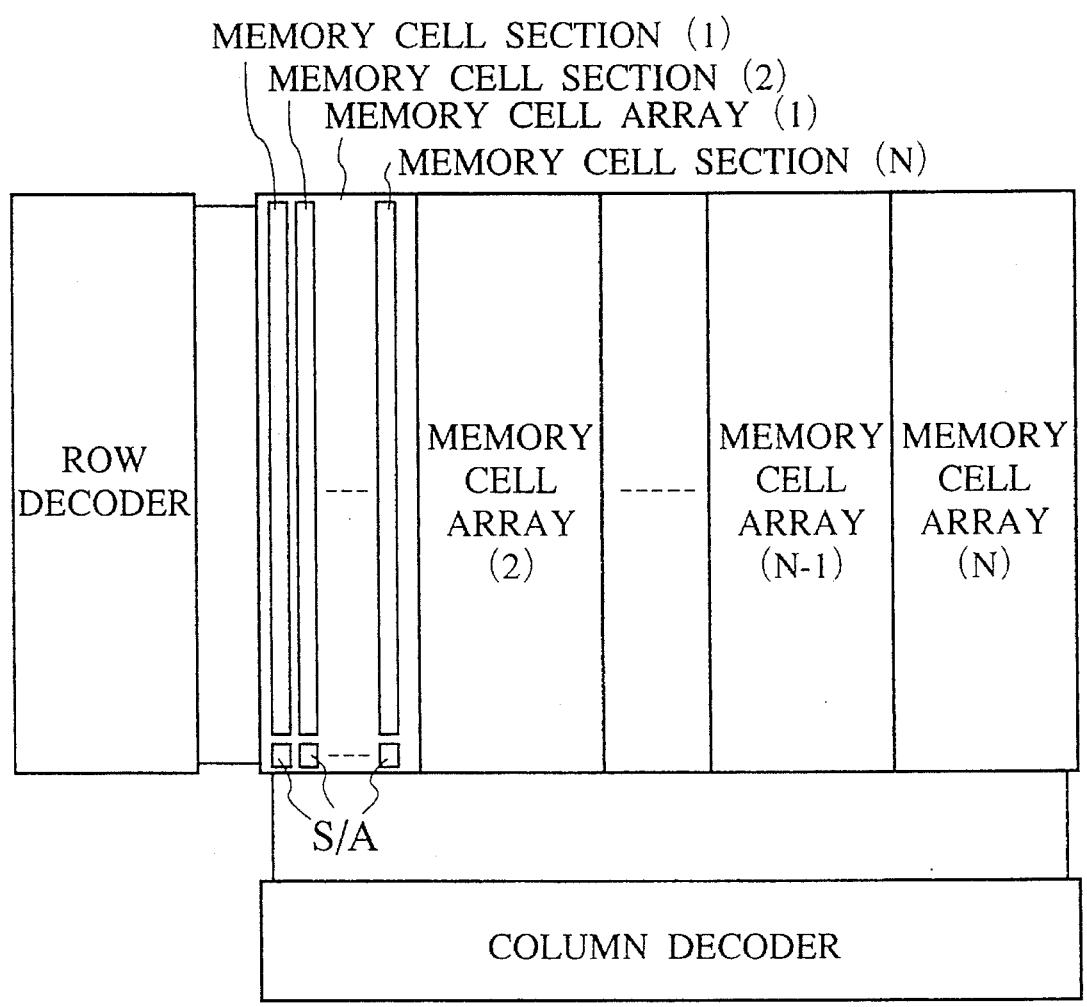
FIG. 8 is a block diagram of the semiconductor memory including a plurality of memory cell sections shown in FIG. 7 according to the present invention

FIG. 8 is a block diagram of a semiconductor memory including a plurality of memory cell array (1) to (N). Each memory cell array comprises a plurality of memory cell sections (1) to (N) as shown in FIG. 7.

Figure 9:
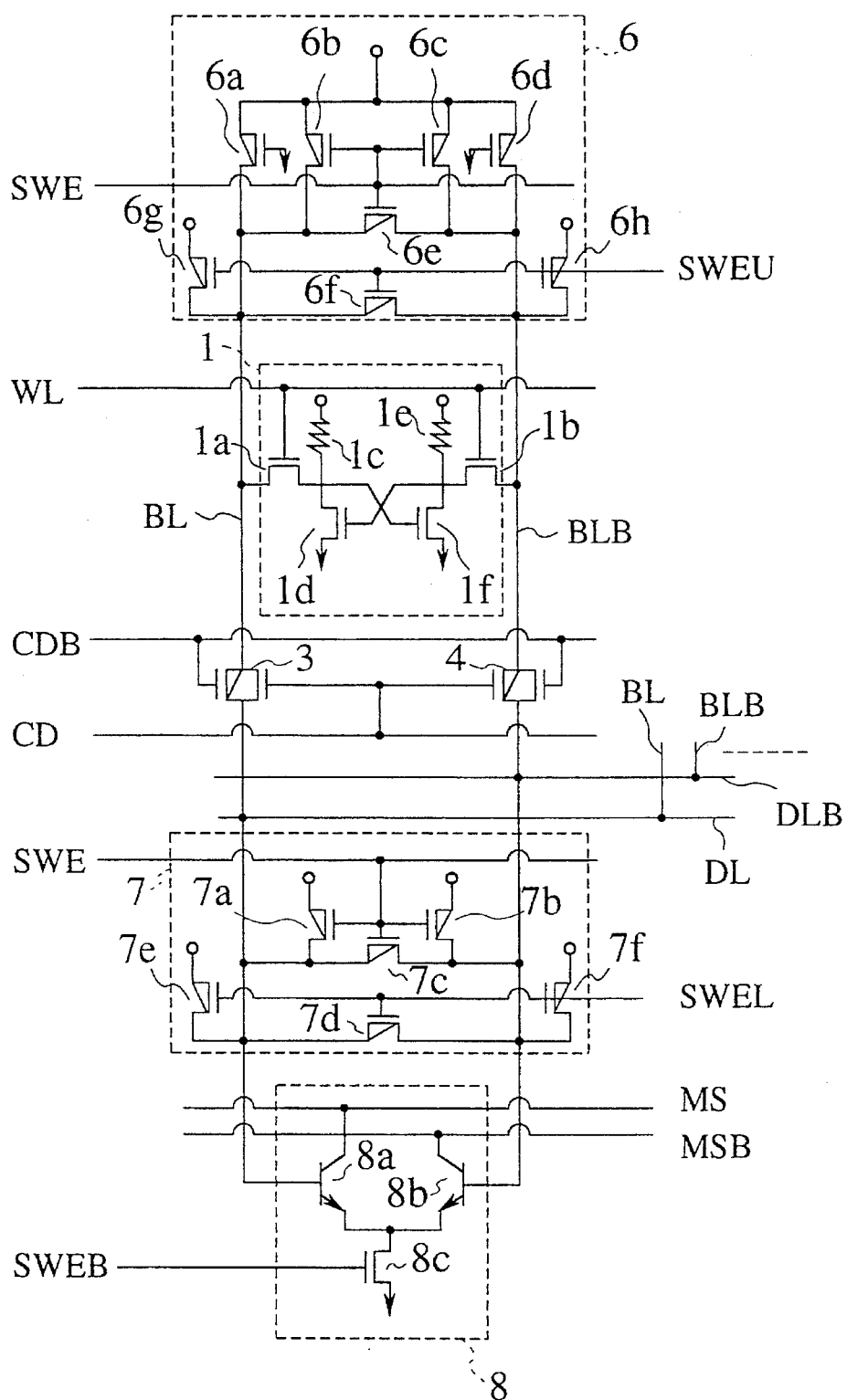
FIG. 9 is a circuit diagram showing a specific example of the bit line peripheral circuit shown in FIG. 6.

FIG. 9 is a circuit diagram showing a specific example of the bit line peripheral circuit shown in FIG. 6.

In FIG. 9, the cell 1 comprises a pair of N-MOSs 1a and 1b whose gates are connected to the word line WL, a resistance 1c and an N-MOS 1d connected in series between a power source and ground, and a resistance 1e connected in series between a power source and ground, and an N-MOS 1f.

The N-MOS 1a is connected between the drain of the N-MOS 1d and the bit line BL. The N-MOS 1b is connected between the drain of the N-MOS 1f and the bit line BLB. The gate and the drain of the N-MOS 1d and the gate and the drain of the N-MOS 1f are cross-connected.

The bit line upper load circuit 6 comprises a plurality of P-MOSs 6a, 6b, 6c, and 6d whose sources are connected to the power supply, a P-MOS 6e whose gate is connected to the section write enable signal SWE, and a plurality of P-MOSs 6f, 6g, and 6h whose gates are supplied with the signal SWEU.

Each gates of the P-MOSs 6a, 6d is connected to the ground, while the drains of the P-MOSs 6a, 6d are connected to the bit lines BL, BLB respectively. The drains of the P-MOSs 6b, 6c are connected to the bit lines BL, BLB respectively, the P-MOSs 6e, 6f are connected in parallel between the bit lines BL, BLB, and the gates of the P-MOSs 6b, 6c are supplied with the section write enable signals SWE. In addition, the sources of the P-MOSs 6g, 6h are connected to the power source and the drains are connected to the bit lines BL, BLB respectively.

The bit line lower load circuit 7 comprises a pair of P-MOSs 7a, 7b, the sources of which are connected to the power source, a P-MOS 7c of which the gate is supplied with the section write enable signal SWE, and a plurality of P-MOSs 7d, 7e, 7f of which the gates are supplied with the signal SWEL.

The drains of the P-MOSs 7a, 7b are connected to the bit lines BL, BLB respectively, the P-MOSs 7c, 7d are connected in parallel between the bit lines BL, BLB, and the gates of the P-MOSs 7a, 7b are supplied with the section write enable signal SWE. In addition, the sources of the P-MOSs 7e, 7f are connected to the power source, and the drains are connected to the bit lines BL, BLB respectively.

The sense amplifier 8 comprises a pair of NPN transistors 8a, 8b which are connected to the respective collectors of the common read lines MS, MSB, and an N-MOS 8c connected between the emitters of the NPN transistors 8a, 8b and the ground. The bit lines BL, BLB are connected to the bases of the NPN transistors 8a, 8b respectively, and the signal SWEB is supplied to the gate of the N-MOS 8c.

Figure 10:
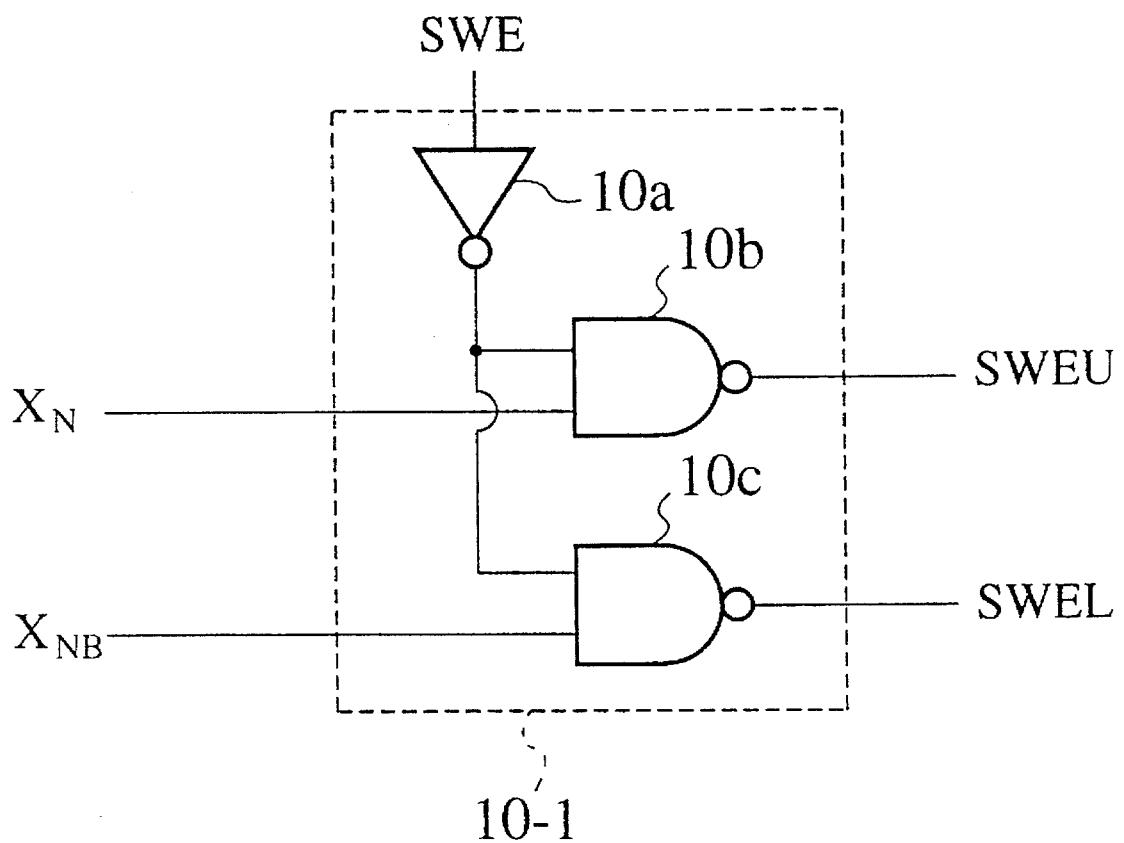
FIG. 10 is a circuit diagram showing the specific configuration of a second section write enable generating circuit 10-1 shown in FIG. 6.

FIG. 10 is a circuit diagram showing the specific configuration of the second section write enable generating circuit 10-1 shown in FIG. 6.

The second section write enable generation circuit 10-1 comprises an inverter 10a for inverting the section write enable signal SWE from the first section write enable generation circuit 9, and a pair of input NAND gates 10b, 10c connected to the output side of the inverter 10a. For example, the contents of a signal XN for the uppermost position row address for determining the address of the lower half and the upper half of the bit line and its inverted signal XNB are respectively supplied to the other input side of the NAND gates 10b, 10c, and the signal SWEU and the signal SWEL are emitted from the output sides.

The cell 1 positioned on the upper sections of the bit lines BL, BLB is selected when, for example, the signal XN for the uppermost position row address is at the low level and the inverted signal XNB is at the high level.

Next, the operation of the embodiment of the bit line peripheral circuit with the above-mentioned configuration will be explained.

When the specified word line WL and the column line CD corresponding to the row address and the column address are activated to the high level by the row decoder 2 and the column decoder 5, the transfer gates 3, 4 are turned ON, and the cell 1 corresponding to the row address and the column address is selected.

When the data is read out, the section write enable signal SWE is switched to the low level and the inverted signal SWEB is changed to the high level. At this time, in the case where the signal XN for the uppermost position row address is at the low level and the inverted signal XNB is at the high level, specifically, in the case where the cell 1 positioned at the upper sections of the bit lines BL, BLB is accessed, the signals SWEU and SWEL are at the high level and the low level respectively.

As a result, in the bit line upper load circuit 6, the P-MOSs 6b, 6c, 6e controlled by the signal SWE are all turned ON, and the P-MOSs 6f to 6h controlled by the signal SWEU are all turned OFF. Also, in the bit line lower load circuit 7, the P-MOSs 7d to 7f controlled by the signal SWEL are all turned ON at the same time as the P-MOSs 7a to 7c controlled by the signal SWE are all turned ON.

As a result, the impedance of the bit line upper load circuit 6 is large and the impedance of the bit line lower load circuit 7 is small. Therefore more cell voltage is supplied to the selected cell 1 from the bit line lower load circuit 7 than from the bit line upper load circuit 6.

Figure 11:
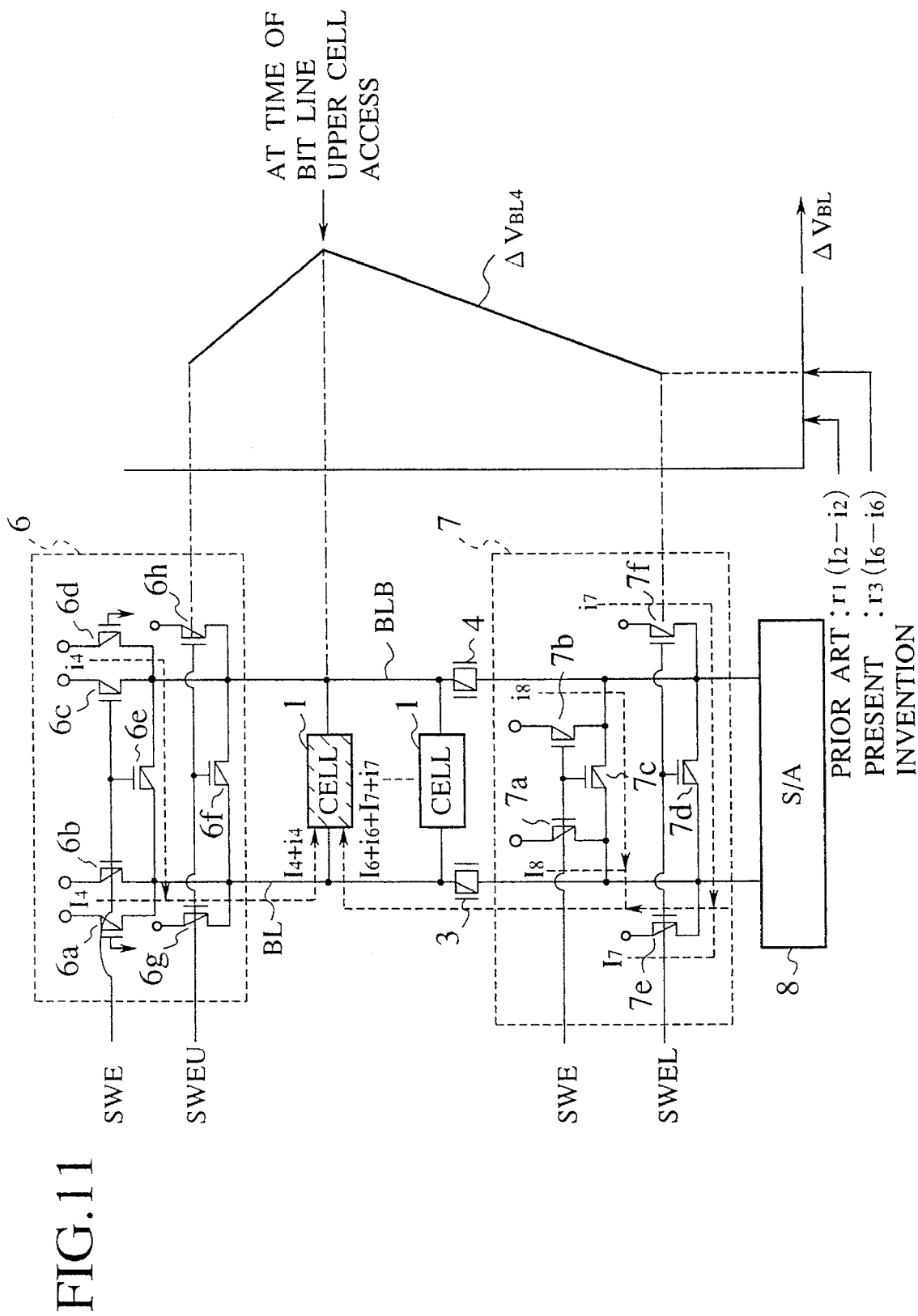
FIG. 11 is a diagram showing the condition of a bit line amplitude ΔVBL during access to a memory cell located at an upper section of bit lines.

To explain in more detail, in the case where the cell 1 at this upper position is accessed, when the bit lines BL, BLB are at the low level and the high level respectively, as illustrated in FIG. 11, a current I4+i4 (equivalent to I1+i1 for the conventional circuit) flows into the cell 1 from the bit line upper load circuit 6. In addition, from the bit line lower load circuit 7, a current I7+i7 from the P-MOSs 7d to 7f of the present invention is added to a current I6+i6 (equivalent to I2+i2 for the conventional circuit) from the P-MOSs 7a to 7c, and a current I6+i6+I7+i7 flows.

In this case, I1+i1>I4+i4, I2+i2<I6+i6+I7+i7. The cell current Icell can be represented as Icell=I1+i1+I2+i2=I4+i4+I6+i6+I7+i7.

Accordingly, the bit line amplitude $\Delta VBL$ can be shown as the solid line $\Delta VBL4$ in FIG. 11, and in the case where the impedance of the P-MOSs 7a, 7b in the bit line lower load circuit 7 is r3 and the impedance of the P-MOSs 7e, 7f is r4, the bit line amplitude D VBL transmitted to the sense amplifier 108 is r3(I6−i6), which is higher than the conventional r1(I2−i2).

During read-out, in the case where the signal XN for the uppermost position row address is at the high level and the inverted signal XNB is at the low level, specifically, in the case where the cell 1 positioned at the lower sections of the bit lines BL, BLB is accessed, the signals SWEU and SWEL are at the low level and the high level respectively.

As a result, in the bit line upper load circuit 6 the P-MOSs 6b, 6c, 6e controlled by the signal SWE are all turned ON, and at the same time the P-MOSs 6f to 6h controlled by the signal SWEU are all turned ON. Also, in the bit line lower load circuit 7, the P-MOSs 7a to 7c controlled by the signal SWE are all turned OFF, and the P-MOSs 7d to 7f controlled by the signal SWEL are all turned OFF.

As a result, as opposed to the case in which the cell 1 at the upper position is accessed, the impedance of the bit line upper load circuit 6 is small and the impedance of the bit line lower load circuit 7 is large. Therefore, more cell current is supplied to the selected cell 1 from the bit line upper load circuit 6 than from the bit line lower load circuit 7.

Figure 12:
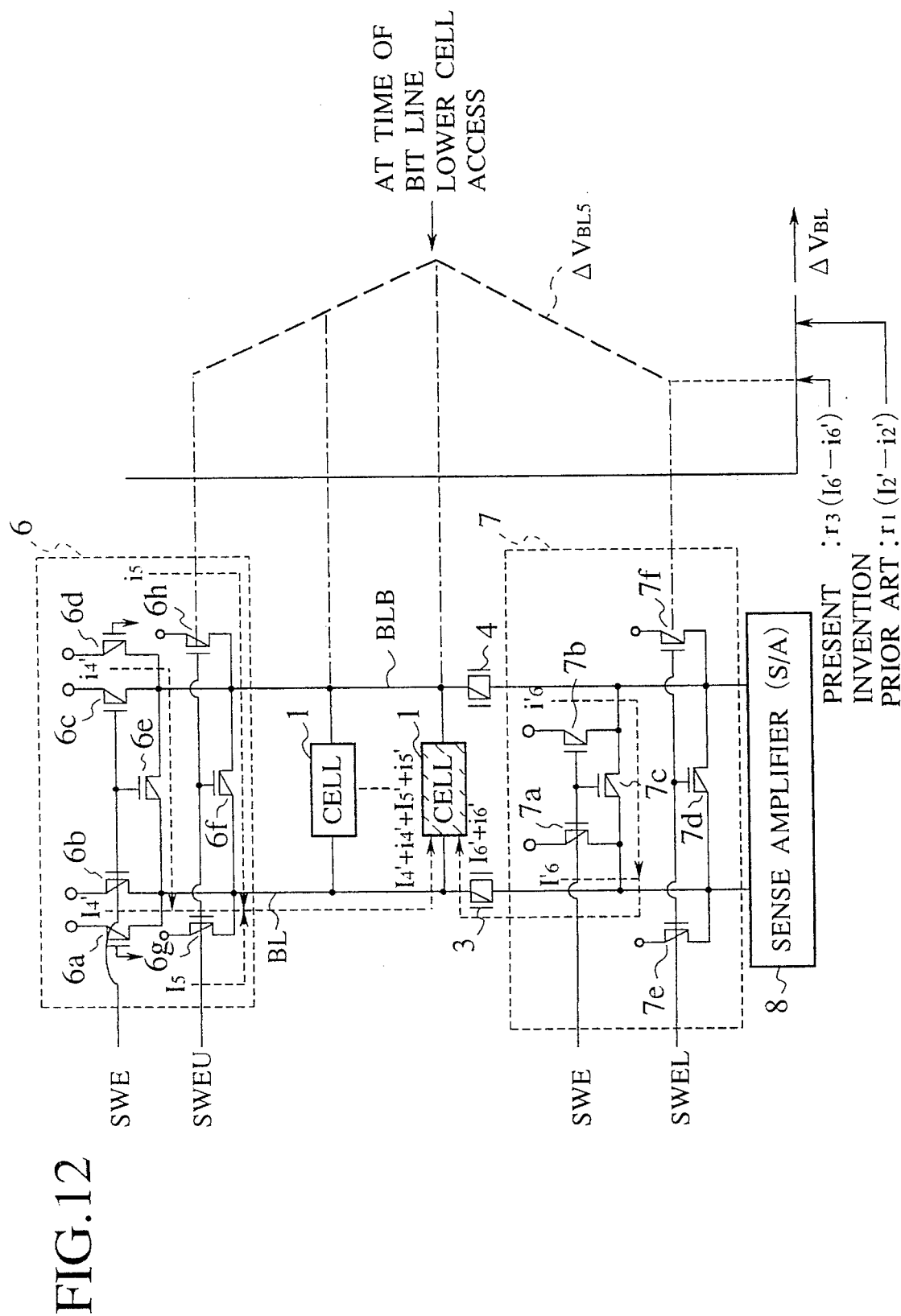
FIG. 12 is a diagram showing the condition of a bit line amplitude ΔVBL during access to a memory cell located at a lower section of bit lines.

Specifically, in this case, when the bit lines BL, BLB are at the low level and the high level respectively, as illustrated in FIG. 12, a current I4+i4+I5+i5, which is a current I5+i5 from the P-MOSs 6f to 6h of the present invention added to a current I4'+i4' (equivalent to I1'+i1' for the conventional circuit) flows into the cell 1. A current I6'+i6' (equivalent to I2'+i2' for the conventional circuit) from the P-MOSs 7a to 7c also flows. In this case, I1'+i1'<I4'+i4'+I5+i5 and I2'+i2'>I6'+i6', and the cell current Icell can be represented as Icell=I1'+i1'+I2'+i2'=I4'+i4'+I5+i5+I6'+i6'.

The cell current Icell can be represented as Icell=I4+i4+I6+i6+I7+i7.

Accordingly, the bit line amplitude ΔVBL can be shown as the dotted line ΔVBL5 shown in FIG. 12, and the bit line amplitude ΔVBL transmitted to the sense amplifier 108 is r3(I6'–i6') which is lower than the conventional r1(I2'–i2').

Figure 13:
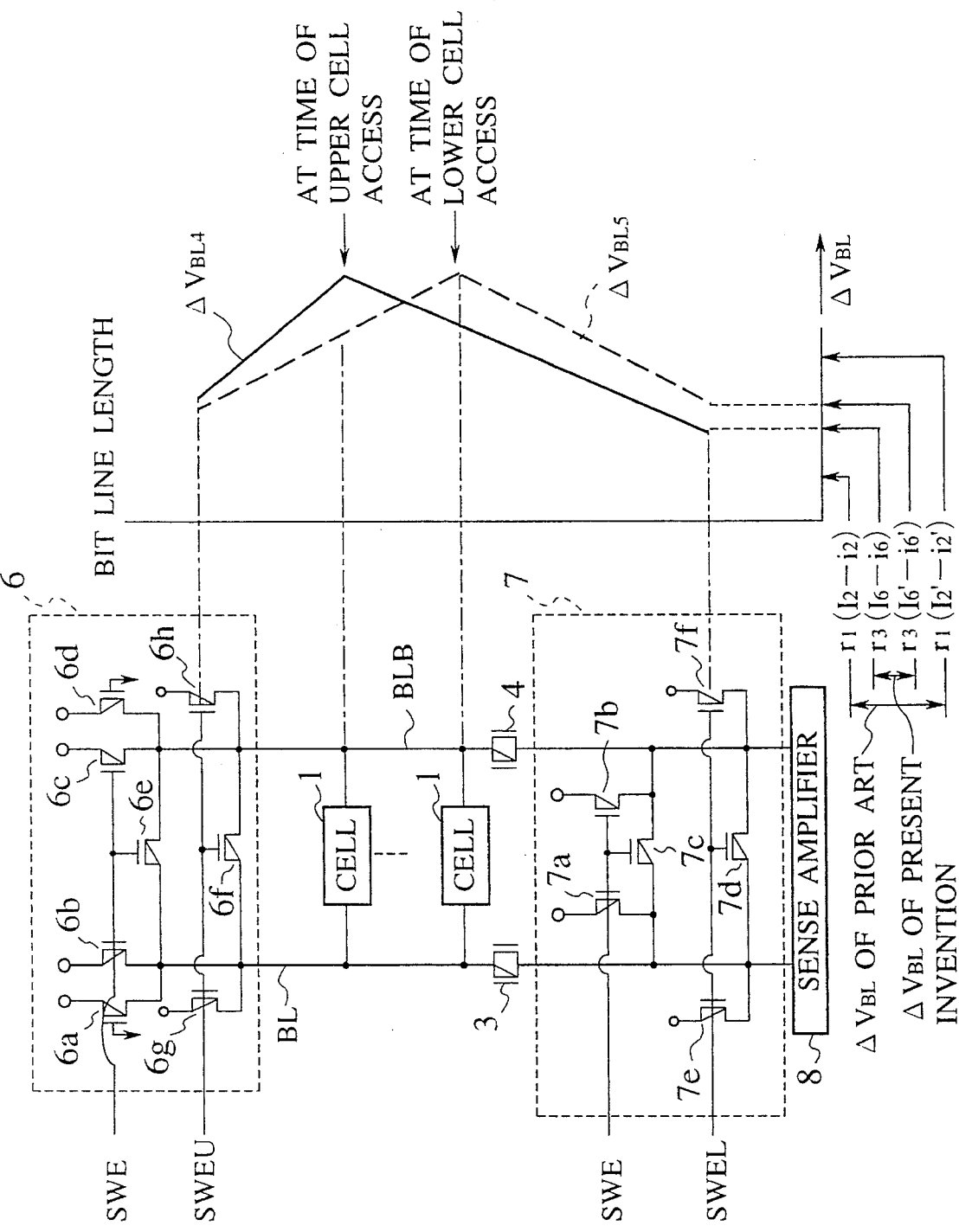
FIG. 13 is a diagram simultaneously showing the conditions of the bit line amplitudes ΔVBL corresponding to the cells at the upper and lower positions of the accessed bit line shown in FIG. 11 and in FIG. 12.

FIG. 13 is a diagram simultaneously showing the conditions of the bit line amplitudes ΔVBL corresponding to the cells at the upper and lower positions of the accessed bit line shown in FIG. 11 and in FIG. 12.

As can be clearly understood from FIG. 11, the row address dependence of the bit line amplitude ΔVBL transmitted into the sense amplifier 8 is considerably smaller for the present embodiment than for the conventional system.

Specifically, in the conventional memory device, because the impedance of the bit line load circuit is always set without reference to the access position of the cell, particularly in the case of a large volume memory, the row address dependence of the bit line amplitude ΔVBL is large. There is therefore a wide variation in the access times during read-out, whereas, with the present embodiment, the impedance of the bit line load circuit is changed according to the row address. Therefore, even when the bit line is long and the memory has a large volume, it is possible to have low address dependence of the bit line amplitude ΔVBL while the data in the bit line pair BL, BLB is being inverted at high speed. As a result, it is possible to reduce the deviation in the access times during read-out.

The present invention is not necessarily limited to the above-mentioned embodiment. Various changes are possible. For example, in this embodiment the bit line load circuit which controls the impedance based on the row address is positioned in two locations, the uppermost section and the lowermost section of the bit line pair BL, BLB. However, the configuration may also be such that, for example, the bit line load circuit is only positioned at the lowermost section of the bit line pair BL, BLB.

In addition, the bit line load circuit is formed from P-MOSs, but it is also acceptable if, for example, bipolar transistors are used. In such a case, the base of the bipolar transistor is controlled to control the impedance of the bit line load circuit.

Figure 14:
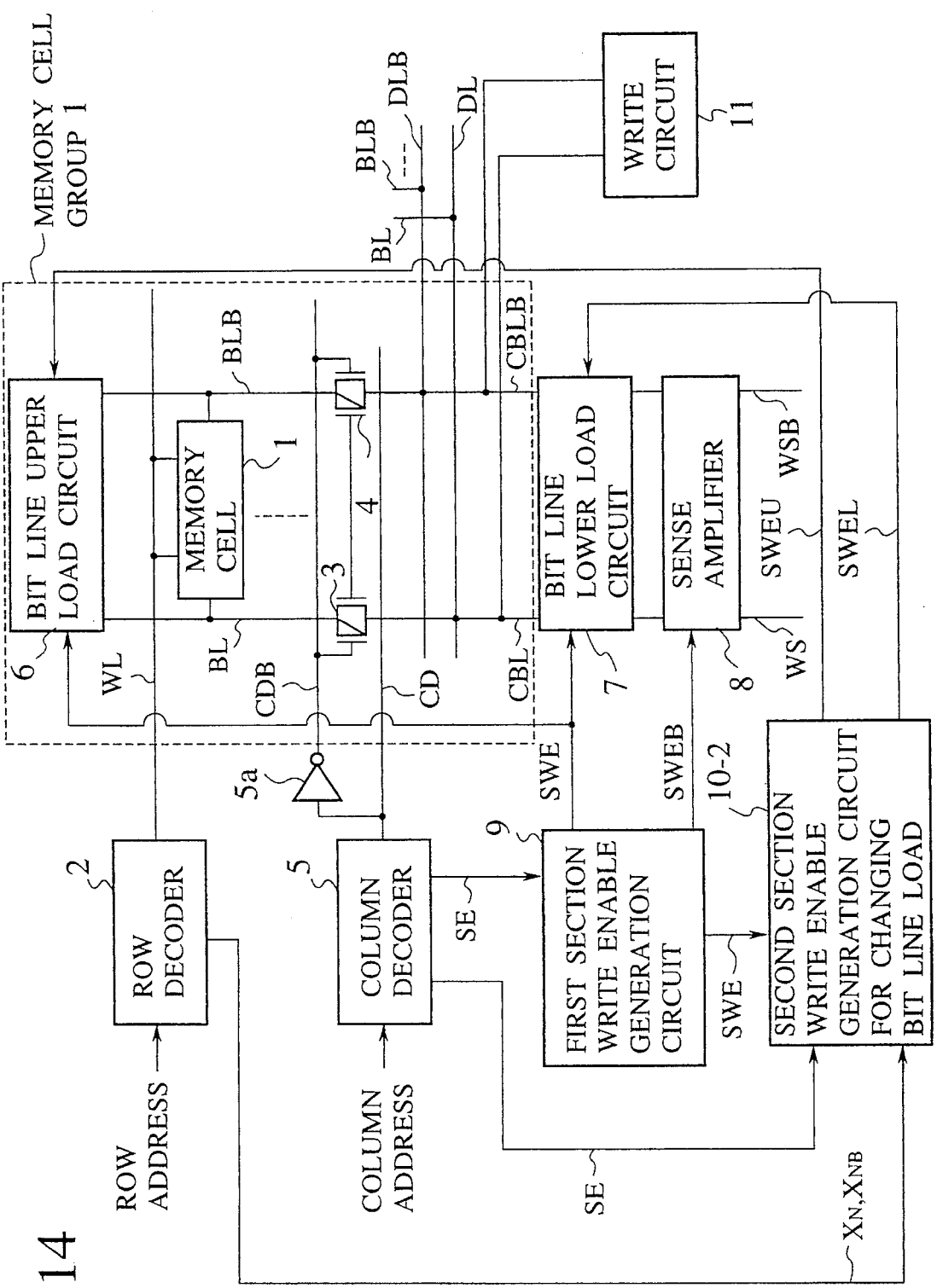
FIG. 14 is a main block diagram showing the configuration of a bit line peripheral circuit in a semiconductor memory such as a SRAM which is another embodiment of a semiconductor memory device of the present invention.

FIG. 14 is a configuration diagram of a bit line peripheral circuit in a semiconductor memory of another embodiment of the present invention. The difference between the bit line peripheral circuits shown in FIGS. 6 and 14 is the configuration and function of the second section write enable generation circuit 10-2 for changing bit line load.

Figure 15:
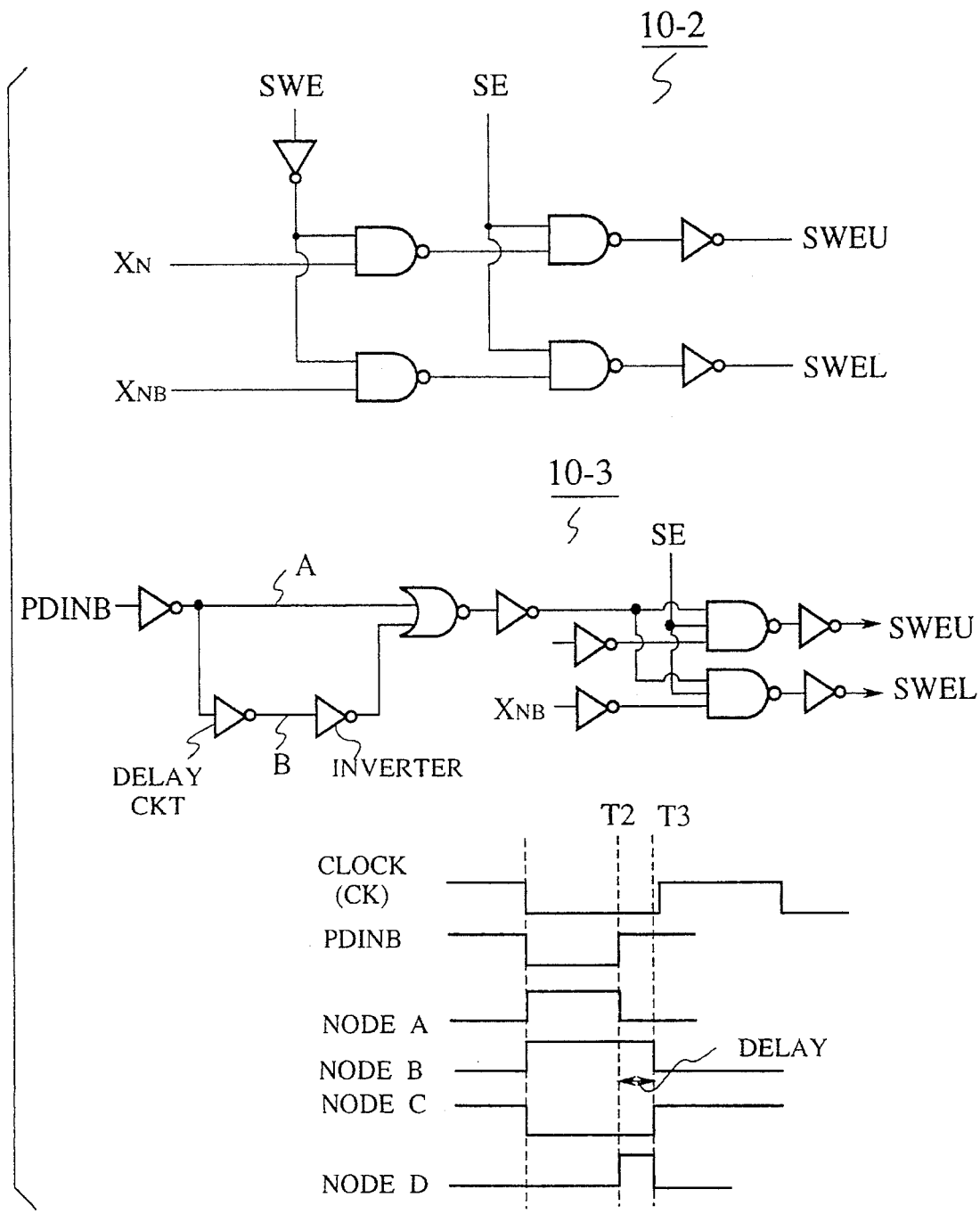
FIG. 15 is another actual configuration diagram of a second selection write enable generation circuit 10-2 as shown in FIG. 14.

FIG. 15 is a configuration diagram of the second section write enable generation circuit 10-2 and 10-3 for changing bit line load incorporated in the bit line peripheral circuit shown in FIG. 14.

As shown in FIG. 8, it is a common used method in design of a semiconductor memory that each memory cell array is divided into a plurality of memory cell sections. The second section write enable generation circuit 10-2 and 10-3 is also provided to each memory cell section like the second section write enable generation circuit 10-1 shown in FIG. 6.

In a selected memory cell section, the potential of the section write enable signal SE is the high level, and is the low level in unselected memory section. In the selected memory section, the selection write enable upper signal SWEU and the selection write enable lower signal SWEL are used by the same manner for the second section write enable generation circuit 10-1 shown in FIG. 10.

In the unselected memory section, the potentials of the both of the signals SWEU and SWEL are the low level. Therefore the bit line load circuit controlled by the signals SWEU and SWEL can perform an equalizing operation and pull-up operation for bit lines reliability rather than that used in the conventional semiconductor memory device. Thereby, it can be possible to execute the section scan operation in a semiconductor memory device with a high speed. In general, the section scan operation decreases a memory cell access time.

The feature of the second section write enable generation circuit 10-2 and 10-3 will be described as follows with reference to FIG. 16. In this case, impedances of bit lines in a section which is not selected are not changed.

Figure 16:
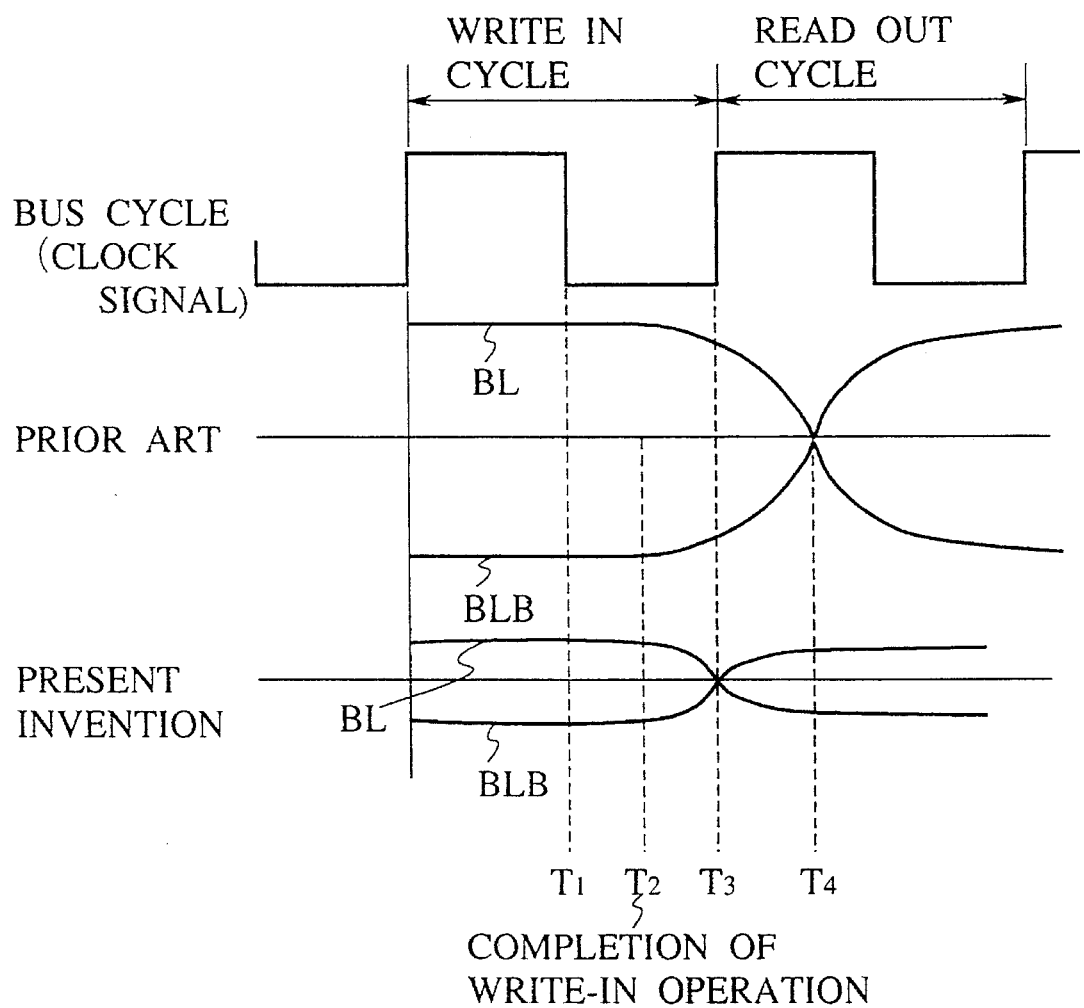
FIG. 16 is a timing chart of the operation of the second selection write enable generation circuit 10-2 shown in FIG. 15.

FIG. 16 is a timing chart showing the operation of the second section write enable generation circuit 10-2 and 10-3 shown in FIG. 15 of this embodiment.

In this timing chart, at the timing T2, the write-in operation to a selected memory cell is completed through the bit line pair BL and BLB.

In the conventional section write enable generation circuit 109, an equalizing operation for the bit line pair BL and BLB is initiated at the rising edge (timing T3) and the read-out operation from a memory cell is commenced after the timing T4.

On the other hand, by using the second section write enable generation circuit 10-2 and 10-3 of this embodiment, the equalizing operation to the bit line pair BL and BLB can be commenced after the completion of the write-in operation and completed before the rising edge of the readout cycle (between timings T2 and T3). Therefore, it can be commenced to perform the read-out operation at the rising edge of the read-out cycle (timing T3). The difference between the timing T3 and timing 4 is approximately 1 nano second. It can be executed to initiate a read-out operation approximately 1 nano second faster in a SRAM of 4Mbit class.

Figure 17:
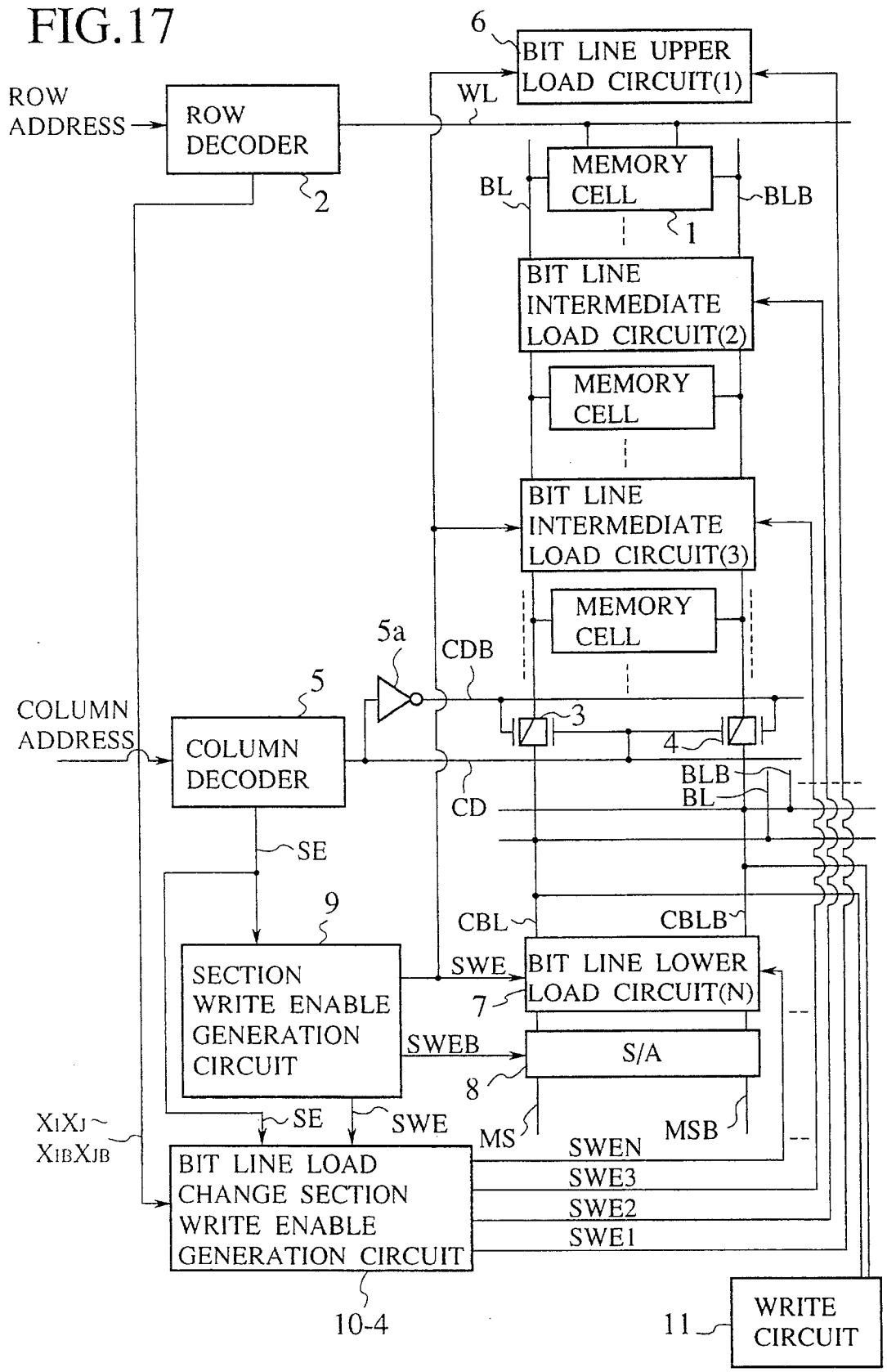
FIG. 17 is a block circuit diagram of another bit line peripheral circuit of a semiconductor memory device such as a SRAM of the present invention.

FIG. 17 shows a block circuit of another bit line peripheral circuit of a SRAM as the embodiment of the semiconductor memory of the present invention.

In the bit line peripheral circuit in the semiconductor memory as shown in FIG. 6, the bit line load circuits 6 and 7 are provided at the upper section of the bit line pair BL and BLB and the lower section of the bit line pair BL and BLB, respectively. On the other hand, in the bit line peripheral circuit shown in FIG. 17, a plurality of bit line load circuits such as a bit line upper load circuit (1), a bit line intermediate load circuit (2), a bit line intermediate load circuit (3), ..., and a bit line lower load circuit (N) are provided at a plurality of parts in the bit lines.

These load circuits (1) to (N) can be accurately controlled by using the configuration of the bit line peripheral circuit shown in FIG. 17 rather than that of the configuration of the bit line peripheral circuit shown in FIG. 6 which controls by using the upper most address.

Figure 18:
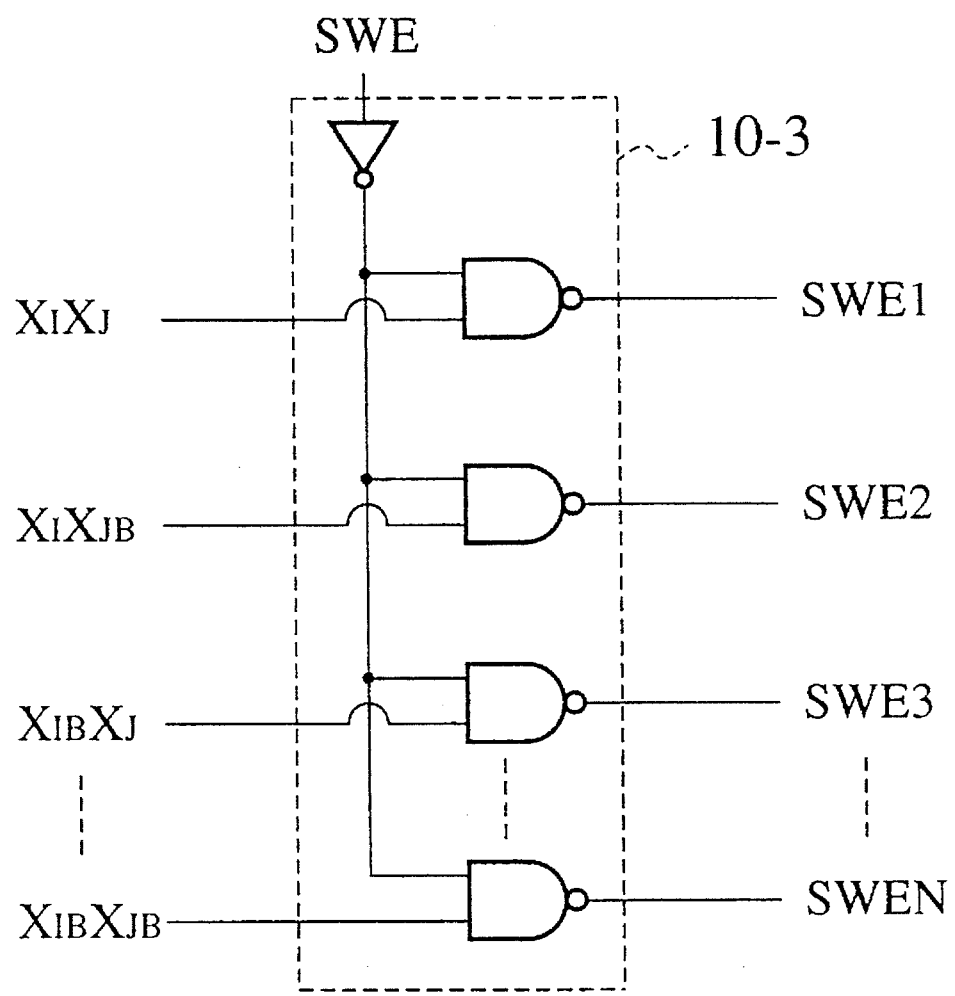
FIG. 18 is an actual configuration of the second section write enable generation circuit 10-3 used in the bit line peripheral circuit shown in FIG. 17.

FIG. 18 shows an actual configuration diagram of the second section write enable generation circuit 10-4 shown in FIG. 17. In FIG. 18, the second section write enable generation circuit 10-4 receives address signals XIXJ, . . . , XIBXJB and generates control signals SWE1 to SWEN to control the bit line load circuits (1) to (N) according to the address signals XIXJ, . . . , XIB,XJB.

As explained in detail above, a semiconductor memory device of the present invention is provided with an impedance control means for controlling the impedance of the bit line load circuit based on the bit line direction address. It is therefore possible to reduce the differences in bit line amplitudes produced as a result of the differences in the bit line position of the accessed cell. As a result, the dependence of the bit line amplitude on the bit line direction address is small, and a high speed access time is possible because the deviation in the access time resulting from the bit line direction address can be reduced.

While the above provides a full and complete disclosure of the preferred embodiments of the present invention, various modifications, alternate constructions and equivalents any be employed without departing from the true spirit and scope of the invention. Therefore the above description and illustration should not be constructed as limiting the scope of the invention, which is defined by the appended claims.

What is claimed is:

1. A semiconductor memory comprising:

a plurality of memory cells for data storage, connected to bit line pair;

a memory cell selection decoder for selecting the memory cell in the plurality of memory cells corresponding to a bit line direction address;

bit line load means for supplying a voltage potential to the bit line pair; and impedance control means for receiving the bit line direction address and changing an impedance of the bit line load means according to the bit line direction address, wherein, the semiconductor memory performs data write-in and data readout operations from/to the memory cell in the plurality of memory cells selected by the memory cell selection decoder through the bit line pair;

the bit line load means comprising a plurality of bit line load circuits whose impedance being changed by the impedance control means by using the bit line direction address, and the plurality of bit line load circuits are provided at one point or at a plurality of points in each of the plurality of bit line pairs; and the plurality of bit line load circuits are provided at an uppermost section over the uppermost memory cell along to the bit line direction and a lowermost section under the lowermost memory cell along to the bit line direction, the impedance control means changes the impedance of the bit line load circuit located in the uppermost section which being greater than the impedance of the bit line load circuit located in the lowermost section during an access operation to the memory cell located in the uppermost section, and changes the impedance of the bit line load circuit located in the uppermost section which being smaller than the impedance of the bit line load circuit located in the lowermost section during an access operation to the memory cell located in the lowermost section.

2. A semiconductor memory comprising:

a plurality of memory cells for data storage, connected to bit line pair;

a memory cell selection decoder for selecting the memory cell in the plurality of memory cells corresponding to a bit line direction address;

bit line load means for supplying a voltage potential to the bit line pair; and impedance control means for receiving the bit line direction address and changing an impedance of the bit line load means according to the bit line direction address, wherein the semiconductor memory performs data write-in and data readout operations from/to the memory cell in the plurality of memory cells selected by the memory cell selection decoder through the bit line pair; and further comprises write-in control signal generation means for receiving the bit line direction address and generating a write-in control signal for performing the write-in operation, and changing one part of the impedance of the bit line load means according to the write-in control signal, wherein, the impedance control means changes the other part of the impedance of the bit line load means according to a result of a logical AND arithmetic operation between the bit line direction address and the write-in control signal;

the bit line load means comprising a plurality of bit line load circuits whose impedance being changed by the impedance control means by using the bit line direction address, and the plurality of bit line load circuits are provided at one point or at a plurality of points in each of the plurality of bit line pairs;

the plurality of bit line load circuits are provided at an uppermost section over the uppermost memory cell along to the bit line direction and a lowermost section under the lowermost memory cell along to the bit line direction, the impedance control means changes the impedance of the bit line load circuit located in the uppermost section which being greater than the impedance of the bit line load circuit located in the lowermost section during an access operation to the memory cell located in the uppermost section, and changes the impedance of the bit line load circuit located in the uppermost section which being smaller than the impedance of the bit line load circuit located in the lowermost section during an access operation to the memory cell located in the lowermost section.

3. A semiconductor memory comprising:

a plurality of bit line pairs;

a plurality of memory cells for data storage, connected to the plurality of bit line pair;

a memory cell selection decoder for selecting the memory cell in the plurality of memory cells corresponding to a bit line direction address;

bit line load means for supplying a voltage potential to each of the plurality of bit line pairs; and impedance control means for receiving the bit line direction address and changing an impedance of the bit line load means for the selected bit line according to the bit line direction address, and for generating a control signal to indicate performing the voltage supply operation of the bit line load means corresponding to the plurality of bit line pairs which being not selected, independent of the bit line direction address and readout/write-in operations, wherein, the bit line load means comprising a plurality of bit line load circuits whose impedance being changed by the impedance control means by using the bit line direction address, and the plurality of bit line load circuits are provided at one point or at a plurality of points in each of the plurality of bit line pairs;

the plurality of bit line load circuits are provided at an uppermost section over the uppermost memory cell along to the bit line direction and a lowermost section under the lowermost memory cell along to the bit line direction, the impedance control means changes the impedance of the bit line load circuit located in the uppermost section which being greater than the impedance of the bit line load circuit located in the lowermost section during an access operation to the memory cell located in the uppermost section, and changes the impedance of the bit line load circuit located in the uppermost section which being smaller than the impedance of the bit line load circuit located in the lowermost section during an access operation to the memory cell located in the lowermost section.

4. A semiconductor memory comprising:

a plurality of bit line pairs;

a plurality of memory cells for data storage, connected to the plurality of bit line pair;

a memory cell selection decoder for selecting the memory cell in the plurality of memory cells corresponding to a bit line direction address;

bit line load means for supplying a voltage potential to each of the plurality of bit line pairs; and impedance control means for receiving the bit line direction address and changing an impedance of the bit line load means according to the bit line direction address, and for generating a control signal to indicate performing the voltage supply operation of the bit line load means corresponding to the plurality of bit line pairs which being selected, independent of the bit line direction address during a rear half of a write-in operation cycle;

wherein, the bit line load means comprising a plurality of bit line load circuits whose impedance being changed by the impedance control means by using the bit line direction address, and the plurality of bit line load circuits are provided at one point or at a plurality of points in each of the plurality of bit line pairs;

the plurality of bit line load circuits are provided at an uppermost section over the uppermost memory cell along to the bit line direction and a lowermost section under the lowermost memory cell along to the bit line direction, the impedance control means changes the impedance of the bit line load circuit located in the uppermost section which being greater than the impedance of the bit line load circuit located in the lowermost section during an access operation to the memory cell located in the uppermost section, and changes the impedance of the bit line load circuit located in the uppermost section which being smaller than the impedance of the bit line load circuit located in the lowermost section during an access operation to the memory cell located in the lowermost section.

5. A semiconductor memory comprising:

a plurality of memory cells for data storage, connected to bit line pair;

a memory cell selection decoder for selecting the memory cell in the plurality of memory cells corresponding to a bit line direction address;

bit line load means for supplying a voltage potential to the bit line pair; and impedance control means for receiving the bit line direction address and changing an impedance of the bit line load means according to the bit line direction address, wherein, the semiconductor memory performs data write-in and data readout operations from/to the memory cell in the plurality of memory cells selected by the memory cell selection decoder through the bit line pair, the bit line load means comprising a plurality of bit line load circuits whose impedance being changed by the impedance control means by using the bit line direction address, and the plurality of bit line load circuits are provided at one point or at a plurality of points in each of the plurality of bit line pairs; and the plurality of bit line load circuits are provided at a plurality of sections in each of the bit line pairs, and the impedance control means changes that the impedance of the bit line load circuit to be accessed according to the bit line direction address is greater than the impedance of the bit line load circuits other than the bit line load circuit to be accessed.

6. A semiconductor memory comprising:

a plurality of memory cells for data storage, connected to bit line pair;

a memory cell selection decoder for selecting the memory cell in the plurality of memory cells corresponding to a bit line direction address;

bit line load means for supplying a voltage potential to the bit line pair; and impedance control means for receiving the bit line direction address and changing an impedance of the bit line load means according to the bit line direction address, wherein the semiconductor memory performs data write-in and data readout operations from/to the memory cell in the plurality of memory cells selected by the memory cell selection decoder through the bit line pair; and further comprises write-in control signal generation means for receiving the bit line direction address and generating a write-in control signal for performing the write-in operation, and changing one part of the impedance of the bit line load means according to the write-in control signal, wherein, the impedance control means changes the other part of the impedance of the bit line load means according to a result of a logical AND arithmetic operation between the bit line direction address and the write-in control signal;

the bit line load means comprising a plurality of bit line load circuits whose impedance being changed by the impedance control means by using the bit line direction address, and the plurality of bit line load circuits are provided at one point or at a plurality of points in each of the plurality of bit line pairs;

the plurality of bit line load circuits are provided at a plurality of sections in each of the bit line pairs, and the impedance control means changes that the impedance of the bit line load circuit to be accessed according to the bit line direction address is greater than the impedance of the bit line load circuits other than the bit line load circuit to be accessed.

7. A semiconductor memory comprising:

a plurality of bit line pairs;

a plurality of memory cells for data storage, connected to the plurality of bit line pairs;

a memory cell selection decoder for selecting the memory cell in the plurality of memory cells corresponding to a bit line direction address;

bit line load means for supplying a voltage potential to each of the plurality of bit line pairs; and impedance control means for receiving the bit line direction address and changing an impedance of the bit line load means for the selected bit line according to the bit line direction address, and for generating a control signal to indicate performing the voltage supply operation of the bit line load means corresponding to the plurality of bit line pairs which being not selected, independent of the bit line direction address and readout/write-in operations, wherein, the bit line load means comprising a plurality of bit line load circuits whose impedance being changed by the impedance control means by using the bit line direction address, and the plurality of bit line load circuits are provided at one point or at a plurality of points in each of the plurality of bit line pairs;

the plurality of bit line load circuits are provided at a plurality of sections in each of the bit line pairs, and the impedance control means changes that the impedance of the bit line load circuit to be accessed according to the bit line direction address is greater than the impedance of the bit line load circuits other than the bit line load circuit to be accessed.

8. A semiconductor memory comprising:

a plurality of bit line pairs;

a plurality of memory cells for data storage, connected to the plurality of bit line pairs;

a memory cell selection decoder for selecting the memory cell in the plurality of memory cells corresponding to a bit line direction address;

bit line load means for supplying a voltage potential to each of the plurality of bit line pairs; and impedance control means for receiving the bit line direction address and changing an impedance of the bit line load means according to the bit line direction address, and for generating a control signal to indicate performing the voltage supply operation of the bit line load means corresponding to the plurality of bit line pairs which being selected, independent of the bit line direction address during a rear half of a write-in operation cycle;

wherein, the bit line load means comprising a plurality of bit line load circuits whose impedance being changed by the impedance control means by using the bit line direction address, and the plurality of bit line load circuits are provided at one point or at a plurality of points in each of the plurality of bit line pairs, the plurality of bit line load circuits are provided at a plurality of sections in each of the bit line pairs, and the impedance control means changes that the impedance of the bit line load circuit to be accessed according to the bit line direction address is greater than the impedance of the bit line load circuits other than the bit line load circuit to be accessed.

9. A semiconductor memory comprising:

a plurality of memory cells for data storage, connected to bit line pair;

a memory cell selection decoder for selecting the memory cell in the plurality of memory cells corresponding to a bit line direction address;

bit line load means for supplying a voltage potential to the bit line pair; and impedance control means for receiving the bit line direction address and changing an impedance of the bit line load means according to the bit line direction address, wherein the semiconductor memory performs data write-in and data readout operations from/to the memory cell in the plurality of memory cells selected by the memory cell selection decoder through the bit line pair;

wherein each of the bit line load means comprises a first load circuit and a second load circuit, each of the first and second load circuits comprises first and second transistors provided between each of the plurality of bit line pairs, a source of each of the first and second transistors is connected to a power supply, and third and fourth transistors provided between the first and second transistors, and the impedance control means changes the impedances of the first load circuit and the second load circuit by connecting the power source to each of the bit line pairs by switching ON/OFF of the first to third transistors.

10. A semiconductor memory comprising:

a plurality of memory cells for data storage, connected to bit line pair;

a memory cell selection decoder for selecting the memory cell in the plurality of memory cells corresponding to a bit line direction address;

bit line load means for supplying a voltage potential to the bit line pair; and impedance control means for receiving the bit line direction address and changing an impedance of the bit line load means according to the bit line direction address, wherein the semiconductor memory performs data write-in and data readout operations from/to the memory cell in the plurality of memory cells selected by the memory cell selection decoder through the bit line pair; and further comprises write-in control signal generation means for receiving the bit line direction address and generating a write-in control signal for performing the write-in operation, and changing one part of the impedance of the bit line load means according to the write-in control signal, wherein, the impedance control means changes the other part of the impedance of the bit line load means according to a result of a logical AND arithmetic operation between the bit line direction address and the write-in control signal;

each of the bit line load means comprises a first load circuit and a second load circuit, each of the first and second load circuits comprises first and second transistors provided between each of the plurality of bit line pairs, a source of each of the first and second transistors is connected to a power supply, and third and fourth transistors provided between the first and second transistors, and the impedance control means changes the impedances of the first load circuit and the second load circuit by connecting the power source to each of the bit line pairs by switching ON/OFF of the first to third transistors.

11. A semiconductor memory comprising:

a plurality of bit line pairs;

a plurality of memory cells for data storage, connected to the plurality of bit line pairs;

a memory cell selection decoder for selecting the memory cell in the plurality of memory cells corresponding to a bit line direction address;

bit line load means for supplying a voltage potential to each of the plurality of bit line pairs; and impedance control means for receiving the bit line direction address and changing an impedance of the bit line load means for the selected bit line according to the bit line direction address, and for generating a control signal to indicate performing the voltage supply operation of the bit line load means corresponding to the plurality of bit line pairs which being not selected, independent of the bit line direction address and readout/write-in operations;

wherein each of the bit line load means comprises a first load circuit and a second load circuit, each of the first and second load circuits comprises first and second transistors provided between each of the plurality of bit line pairs, a source of each of the first and second transistors is connected to a power supply, and third and fourth transistors provided between the first and second transistors, and the impedance control means changes the impedances of the first load circuit and the second load circuit by connecting the power source to each of the bit line pairs by switching ON/OFF of the first to third transistors.

12. A semiconductor memory comprising:

a plurality of bit line pairs;

a plurality of memory cells for data storage, connected to the plurality of bit line pairs;

a memory cell selection decoder for selecting the memory cell in the plurality of memory cells corresponding to a bit line direction address;

bit line load means for supplying a voltage potential to each of the plurality of bit line pairs; and impedance control means for receiving the bit line direction address and changing an impedance of the bit line load means according to the bit line direction address, and for generating a control signal to indicate performing the voltage supply operation of the bit line load means corresponding to the plurality of bit line pairs which being selected, independent of the bit line direction address during a rear half of a write-in operation cycle;

wherein each of the bit line load means comprises a first load circuit and a second load circuit, each of the first and second load circuits comprises first and second transistors provided between each of the plurality of bit line pairs, a source of each of the first and second transistors is connected to a power supply, and third and fourth transistors provided between the first and second transistors, and the impedance control means changes the impedances of the first load circuit and the second load circuit by connecting the power source to each of the bit line pairs by switching ON/OFF of the first to third transistors.

13. A semiconductor memory comprising:

a plurality of memory cells for data storage, connected to bit line pair;

a memory cell selection decoder for selecting the memory cell in the plurality of memory cells corresponding to a bit line direction address;

bit line load means for supplying a voltage potential to the bit line pair; and impedance control means for receiving the bit line direction address and changing an impedance of the bit line load means according to the bit line direction address, wherein, the semiconductor memory performs data write-in and data readout operations from/to the memory cell in the plurality of memory cells selected by the memory cell selection decoder through the bit line pair;

the bit line load means comprising a plurality of bit line load circuits whose impedance being changed by the impedance control means by using the bit line direction address, and the plurality of bit line load circuits are provided at one point or at a plurality of points in each of the plurality of bit line pairs;

each of the bit line load means comprises a first load circuit and a second load circuit, each of the first and second load circuits comprises first and second transistors provided between each of the plurality of bit line pairs, a source of each of the first and second transistors is connected to a power supply, and third and fourth transistors provided between the first and second transistors, and the impedance control means changes the impedances of the first load circuit and the second load circuit by connecting the power source to each of the bit line pairs by switching ON/OFF of the first to third transistors.

14. A semiconductor memory as claimed in claim 9, wherein the impedance control means changes a voltage potential of a gate of each of the first to third transistors when each of the first to third transistors is a MOS FET in order to change the impedance of the bit line load means.

15. A semiconductor memory as claimed in claim 10, wherein the impedance control means changes a voltage potential of a gate of each of the first to third transistors when each of the first to third transistors is a MOS FET in order to change the impedance of the bit line load means.

16. A semiconductor memory as claimed in claim 11, wherein the impedance control means changes a voltage potential of a gate of each of the first to third transistors when each of the first to third transistors is a MOS FET in order to change the impedance of the bit line load means.

17. A semiconductor memory as claimed in claim 12, wherein the impedance control means changes a voltage potential of a gate of each of the first to third transistors when each of the first to third transistors is a MOS FET in order to change the impedance of the bit line load means.

* * * * *